(12) United States Patent  (10) Patent No.: US 8,882,368 B2
Hayashi  (45) Date of Patent: Nov. 11, 2014

(54) OPTICAL COMMUNICATION MODULE

(75) Inventor: Shigeo Hayashi, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 242 days.

(21) Appl. No.: 13/509,964

(22) PCT Filed: Apr. 23, 2010

(86) PCT No.: PCT/JP2010/057295
§ 371 (c)(1),
(2), (4) Date: May 15, 2012

(87) PCT Pub. No.: WO2011/067951
PCT Pub. Date: Jun. 9, 2011

(65) Prior Publication Data
US 2012/0224817 A1 Sep. 6, 2012

(30) Foreign Application Priority Data

Dec. 3, 2009 (JP) ................................. 2009-275749
Dec. 3, 2009 (JP) ................................. 2009-275750
Dec. 3, 2009 (JP) ................................. 2009-275751

(51) Int. Cl.
*G02B 6/36* (2006.01)
*G02B 6/42* (2006.01)
*H01S 5/022* (2006.01)
*H01L 31/0232* (2014.01)

(52) U.S. Cl.
CPC ......... *H01S 5/02288* (2013.01); *H01S 5/02284* (2013.01); *H01L 31/02325* (2013.01); *H01S 5/02216* (2013.01); *G02B 6/4246* (2013.01); *G02B 6/4206* (2013.01); *H01S 5/02248* (2013.01); *H01S 5/02292* (2013.01)
USPC .................................. 385/93; 385/31; 385/33

(58) Field of Classification Search
None
See application file for complete search history.

(56) References Cited

U.S. PATENT DOCUMENTS 6,328,484 B1 12/2001 Uebbing
7,118,293 B2 * 10/2006 Nagasaka et al. ............... 385/89
7,149,376 B2 * 12/2006 Uchida et al. ................... 385/15

(Continued)

FOREIGN PATENT DOCUMENTS

GB 2 330 425 A 4/1999
JP A-08-264883 10/1996

(Continued)

OTHER PUBLICATIONS

May 25, 2010 International Search Report issued in International Patent Application No. PCT/JP2010/057295.

*Primary Examiner* — Hemang Sanghavi
(74) *Attorney, Agent, or Firm* — Oliff PLC

(57) ABSTRACT

It is expected to provide an optical communication module that can avoid the reduction in the performance of light communication when an edge emitting type photoelectric device is mounted. The optical communication module is configured to include: a basement where a convex first and second lenses are integrally formed on the upper and lower surfaces, respectively; and a laser diode aligned with the first lens on the upper surface to emit light in the direction toward the first lens. It is configured that the first lens refracts the light emitted from the laser diode to become substantially parallel to the upper surface of the basement and the refracted light is reflected toward the direction of second lens.

19 Claims, 14 Drawing Sheets

A

(56) References Cited

U.S. PATENT DOCUMENTS

| | | |
|---|---|---|
| 7,334,918 B2 | 2/2008 | Newton et al. |
| 7,370,414 B2 | 5/2008 | Ice |
| 7,455,463 B2 | 11/2008 | Togami et al. |
| 8,641,296 B2 * | 2/2014 | Nishimura ............... 385/92 |
| 2002/0020803 A1 | 2/2002 | Suzuki et al. |
| 2003/0053222 A1 | 3/2003 | Togami et al. |
| 2004/0202477 A1 | 10/2004 | Nagasaka et al. |
| 2005/0111503 A1 | 5/2005 | Ishigami et al. |
| 2006/0067690 A1 | 3/2006 | Tatum et al. |
| 2006/0077778 A1 | 4/2006 | Tatum et al. |
| 2006/0104576 A1 | 5/2006 | Nagasaka |
| 2008/0037929 A1 * | 2/2008 | Kim et al. ............... 385/14 |
| 2008/0217516 A1 | 9/2008 | Suzuki et al. |
| 2008/0266638 A1 | 10/2008 | Shinoda et al. |
| 2010/0265983 A1 | 10/2010 | Adachi et al. |

FOREIGN PATENT DOCUMENTS

| | | |
|---|---|---|
| JP | A-10-321900 | 12/1998 |
| JP | A-11-174265 | 7/1999 |
| JP | A-2000-162474 | 6/2000 |
| JP | A-2001-296459 | 10/2001 |
| JP | A-2003-503858 | 1/2003 |
| JP | A-2003-101118 | 4/2003 |
| JP | A-2003-149510 | 5/2003 |
| JP | A-2004-235418 | 8/2004 |
| JP | A-2004-246279 | 9/2004 |
| JP | A-2005-167189 | 6/2005 |
| JP | A-2006-040976 | 2/2006 |
| JP | A-2006-139098 | 6/2006 |
| JP | A-2007-304298 | 11/2007 |
| JP | A-2007-324303 | 12/2007 |
| JP | A-2008-046638 | 2/2008 |
| JP | A-2008-515343 | 5/2008 |
| JP | A-2008-277445 | 11/2008 |
| JP | A-2010-238751 | 10/2010 |
| JP | A-2010-251649 | 11/2010 |
| JP | A-2011-003610 | 1/2011 |
| WO | WO 01/01497 A1 | 1/2001 |
| WO | WO 01/15348 | 3/2001 |
| WO | WO 2006/039146 A2 | 4/2006 |
| WO | WO 2008/079338 A2 | 7/2008 |

* cited by examiner

F I G. 3
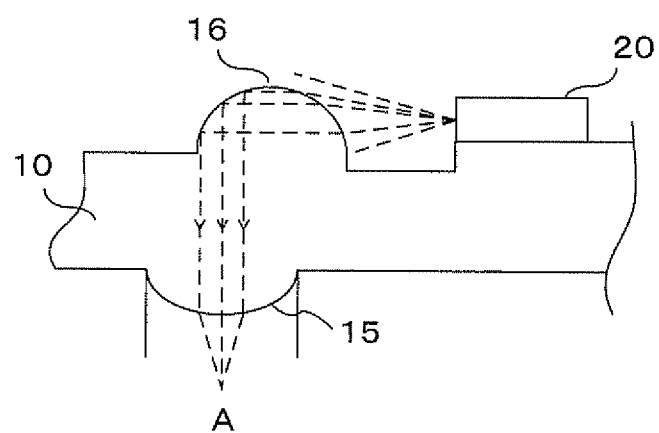

F I G. 4
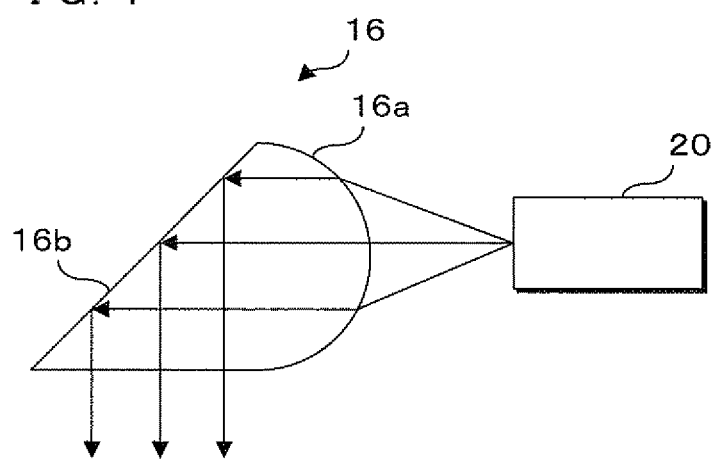

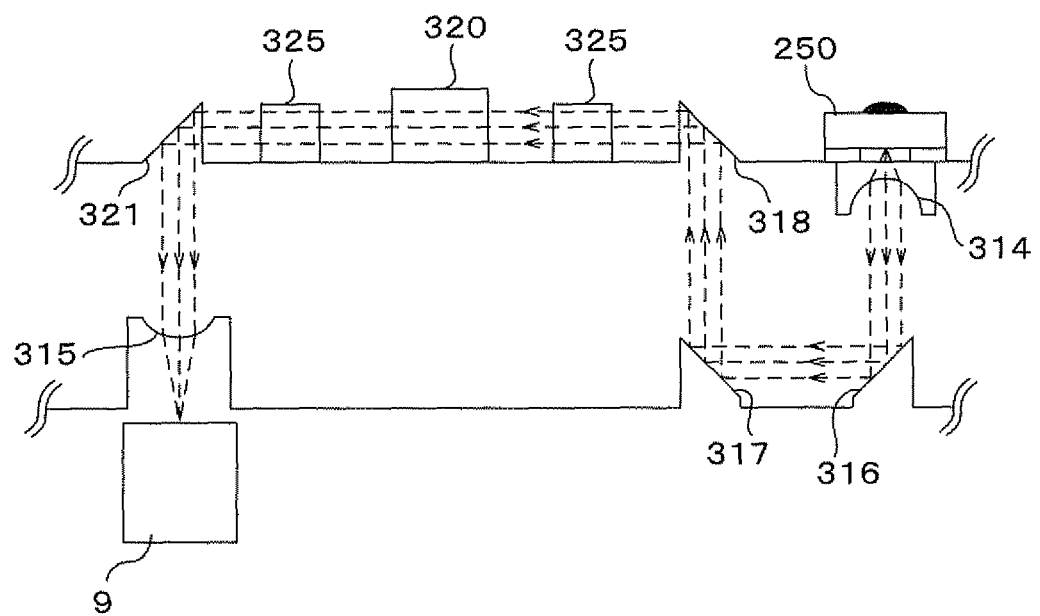
F I G. 1 3

OPTICAL COMMUNICATION MODULE

This application is the national phase under 35 U.S.C. §371 of PCT International Application No. PCT/W2010/057295 which has an International filing date of Apr. 23, 2010 and designated the United States of America.

BACKGROUND OF THE INVENTION

1. Field of the Invention

The present invention relates to an optical communication module that packages a photoelectric device, such as a laser diode and/or photodiode for performing optical communication.

2. Description of Related Art

Conventionally, the optical communication has become widespread, which utilizes an optical fiber and the like. The optical communication is performed with a light emitter, such as a laser diode, converting an electrical signal into an optical signal, with an optical fiber through which the optical signal is transmitted, and with a light receiver, such as a photodiode, converting the received optical signal into the electrical signal. Thus, it is well known to utilize an optical communication module that packages the photoelectric conversion devices, such as the laser diode and/or the photodiode, together with a peripheral circuit element for operating the photoelectric conversion device in the optical communication module depending on circumstances. Such an optical communication module is called as the optical sub-assembly (OSA). Recently, several inventions are reported for the optical communication and the optical communication module.

For example, Patent Document 1 proposes to utilize a configuration in which an output of a first photodiode for receiving light and an output of a second photodiode shielded from light are respectively input into differential amplifiers through gain control amplifiers, and a lowpass filter is arranged between an output terminal of an optical power detecting unit that detects an optical power and a gain control terminal of the gain control amplifier, for implementing an optical detector that can be applied to a high-speed and dynamic-range communication.

In addition, Patent Document 2 proposes an optical reception apparatus that can control adequately the amount of operating current/voltage and reduce the electrical power consumption, with a configuration in which a photodiode for receiving a signal, a photodiode for detecting an optical level, a signal amplifier that amplifies a received signal and a bias current control unit that controls a bias current provided to the signal amplifier are mounted on a single board, and the bias current control unit makes the signal amplifier operate when the signal current output from the photodiode for detecting the optical level is equal to or more than a predetermined value. In that optical reception apparatus, the photodiode for receiving the signal further includes a photosensitive area formed in a substantial circular shape smaller than the diffusion of the optical signal, and the photodiode for detecting the optical level further includes a photosensitive area that surrounds the photosensitive area of the photodiode for receiving the signal, for efficiently detecting the optical signal and enhancing the reception ability.

The inventions according to Patent Documents 1 and 2 relate to a peripheral circuit of a photoelectric conversion device, and expect to enhance the ability of the optical communication lead by the modification of the peripheral circuit. The inventions according to Patent Documents 1 and 2 utilize an optical communication module in which the board mounting the photoelectric conversion device and the peripheral circuit is fixed to a lead frame and sealed by resin to form a molded part, and a hemisphere lens is arranged on the surface of the molded part. This optical communication module is configured to make the lens arranged opposite to an exit terminal of the optical fiber.

Patent Document 3 proposes a light-electric conversion module excelling in the high frequency characteristic and being downsized, as the module includes: a photoelectric device that sends and receives optical signals; a stem that fixes the photoelectric device; a cap that covers the photoelectric device; and plural leads that apply electrical signals to the photoelectric device or transfer the electrical signals sent from the photoelectric device, wherein a plane portion is arranged on one end of a predetermined lead in the package configured with the stem and cap, and an electrical circuit component is arranged on the plane portion, one end of the electrical circuit connected to the photoelectric device, and the other end of the electrical circuit connected to the lead.

Patent Document 4 proposes an optical device module that makes the circuit component on the circuit board and the like operate a light source and/or optical detector, as the module includes: the light source and/or optical detector; a first package having a first surface with an opened portion for passing the optical signal and the second surface opposed to the first surface; a second package having an opened portion to accommodate a circuit board and the like and arranged perpendicular to the second surface of the first package; a leadframe that mechanically connects the first package and second package, and electrically connects the light source and/or optical detector of the first package with a contact point exposed in the opened portion of the second package, wherein an accommodated part, such as the circuit board, is mechanically connected with the second package and electrically connected with the contact point in the opened portion. In this optical device module, a lens block holding a lens is fixed to the first package, and an optical fiber is fit into the opened portion of the lens block.

Patent Document 5 proposes a method for manufacturing a leadframe connector utilized to connect an optical subassembly with a PCB (printed circuit board) of the optical communication module. In this method, a shape of a conductive portion is punched on a conductive ribbon, the conductive portion is bent appropriately, the open reel system is utilized for forming a case that insulates the conductive portion through the injection molding process, and then the conductive ribbon is cut to form each of manufactured leadframe connectors. The plural conductive portions in the single case can be electrically separated by penetrating the connected potion through the hole formed on the case.

3. Prior Art Document

Patent Document 1: Japanese Patent Application Laid-Open No. 2006-40976
Patent Document 2: International Publication No. WO 01/015348
Patent Document 3: Japanese Patent Application Laid-Open No. 2005-167189
Patent Document 4: U.S. Pat. No. 7,455,463
Patent Document 5: U.S. Pat. No. 7,370,414

SUMMARY OF THE INVENTION

In a conventional optical communication module, the photoelectric conversion device (and the peripheral circuit) is (are) often mounted on the leadframe, and the photoelectric conversion device and the leadframe are often sealed by transparent resin. In addition, the lens is often configured integrally by resin. That configuration may cause a problem that the precision of the optical communication is reduced, because it causes a positional offset of the lens and the photoelectric conversion device if the precision for forming resin is low. Furthermore, that configuration may cause a problem that the range of resin selection is narrow, because the photoelectric conversion device is kept in a high temperature environment during the resin sealing and the resin should be selected in view of the heat resistance performance of the photoelectric conversion device. Therefore, it is difficult to solve the problems with the resin that can enhance the forming precision.

An optical fiber for performing optical communication is configured with a core in which light passes and with a clad that covers around the core to trap the light. Several optical fibers are known with respect to the materials of core and clad. For example, HPCF (hard polymer clad fiber) is configured with the core made of silica glass and with the clad made of high strength plastic and covers the core, and AGF (all silica glass fiber) is configured with the core and clad that are made of silica glass. The optical fiber is selected in accordance with the communication speed, costs and the like. As the HPCF is utilized for the optical communication with a relatively low speed, the diameter of the core is about 200 μm. As the AGF is utilized for the optical communication with a relatively high speed, the diameter of the core is about a few μm to tens of μm. On the other hand, the size of light emitting portion in the laser diode is about a few μm to tens of μm, and the size of light receiving portion in the photodiode is about tens of μm. Thus, it is required for the AGF whose core has a smaller diameter to adjust the positions of light emitting portion in the laser diode and light receiving portion in the photodiode.

The invention of Patent Document 1 seals the photoelectric device with resin to form a molded portion, and arranges a lens unit on the surface of molded portion. Thus, it may cause a mismatch between the position of photoelectric device and the position of lens unit and cause reduction in the accuracy of optical communication, when the lens unit is not precisely formed with resin. In addition, the invention of Patent Document 1 requires to arrange the optical communication module to keep the exit end of optical fiber opposed to the lens unit. The positioning of these components is performed by inserting the optical fiber and communication module into grooves configured on a different member, respectively. However, it is difficult to complete the positioning only by respectively inserting the communication module and optical fiber into the grooves on the different member and it is required to adjust the positions of optical fiber and lens unit in the case of optical fiber for the high speed optical communication (e.g., AGF), because of a problems of precision in forming the molded part of the communication module, precision in forming the member having the groove into which the communication module is inserted, and the like.

While the laser diode converting an electrical signal into an optical signal is known as an example of the photoelectric device, there is not only a photoelectric device that emits light perpendicular to the board on which the photoelectric device is mounted but also a photoelectric device that emits light parallel to the board on which the photoelectric device is mounted, a so-called edge emitting type photoelectric device, and the like. Thus, the optical communication module is required to accurately communicate even in the case that the edge emitting type photoelectric device is mounted.

When an optical communication apparatus performs bidirectional communication, the optical communication apparatus must include a light receiving element, e.g., a photodiode, and a light emitting element, e.g., a laser diode, as the photoelectric device. Thus, it is required to provide an optical communication module that includes both photoelectric devices, i.e., the light receiving element and light emitting element, and can transmit optical signals. Such an optical communication module can contribute to downsize the optical communication apparatus.

The inventions of Patent Documents 1 and 2 utilize the photodiode for receiving optical signals, as the photoelectric device. However, they do not describe about the optical communication module sending the optical signal, or about the configuration in that plural photoelectric devices are mounted. The invention of Patent Document 3 utilizes one photoelectric device that performs any one of the sending and receiving operations, and it does not describe about the configuration in that plural photoelectric devices are mounted.

The optical device module of Patent Document 4 includes both photoelectric devices, i.e., the light source and optical detector, in the first package, and can transmit optical signals. However, it is difficult for the optical device module of Patent Document 4 to narrow the distance between two photoelectric devices, because the optical device module of Patent Document 4 is configured to include the light source and, optical detector arranged in two opened portions of the first package, and to make the light source and optical detector perform the transmission of optical signals through two lenses arranged on the lens block fixed to the first package. Thus, the optical device module of Patent Document 4 has the disadvantage of difficulty for downsizing.

The leadframe connector of Patent Document 5 is utilized for connecting one photoelectric device and circuit board. Thus, two leadframes are required to connect each photoelectric device with the circuit board, in the case that the optical communication apparatus is configured to include two photoelectric devices, i.e., light receiving element and light emitting element. Hence, the downsizing is difficult.

For example, an external modulation method is known for the optical communication, which modulates the light between the photoelectric device and the optical fiber. In the external modulation method, it is required to arrange a modulator or the like between the photoelectric device and optical fiber in the optical communication module for the external modulation. However, the modulator or the like cannot be arranged inside the optical communication module, in the invention of Patent Document 1 where the exit end of optical fiber is opposed to the lens unit. Furthermore, the communication performance may be deteriorated when the alignment and connection are not precisely performed for the photoelectric device and optical fiber with respect to the optical device.

The present invention is made in view of such circumstances, and has an object to provide an optical communication module that can prevent reduction in the optical communication performance when a photoelectric device of an edge emitting type is mounted.

Another object of the present invention is to provide an optical communication module that includes plural lenses respectively inputting and outputting light to photoelectric devices, wherein the distance between lenses can be narrowed to downsize the optical communication module, even in the case that plural photoelectric devices are mounted.

Another object of the present invention is to provide an optical communication module in which an optical element, such as a modulator or an optical filter, can be mounted without deterioration in the communication performance.

An optical communication module according to the present invention is a module in which a photoelectric device is arranged on a front surface of a transparent board whose front surface or back surface has a convex lens and light input and output to/from the photoelectric device is transmitted to and from the convex lens through the transparent board, comprising: one or more reflecting portions that is optically connected to the convex lens, is arranged on the front surface or back surface of the transparent board and reflects light to lead the light from the convex lens to the photoelectric device or from the photoelectric device to the convex lens through inside or outside of the transparent board, wherein the photoelectric device transmits light through inside of the transparent board, the reflecting portion and the convex lens.

According to the present invention, the photoelectric device arranged on the front surface of the transparent board included in the optical communication module performs the transmission of light with the convex lens on the front or back surface of the transparent board through the inside of transparent board and the reflecting portion.

Therefore, even when the photoelectric device is a so-called edge emitting type device transmitting light along the front surface of the transparent board, it is possible to make the reflecting portion reflect light emitted from the photoelectric device, to pass the reflected light into the transparent board toward the back surface, and to the convex lens on the transparent board.

In addition, when plural photoelectric devices are arranged with a space in order to avoid an effect of noise, it is possible to make the reflecting portion reflect light, to perform the transmission of light with the convex lens corresponding to each photoelectric device, and to narrow the distance between plural convex lenses corresponding to the plural photoelectric devices.

In addition, for example, it is possible to make the light emitting element emit light, to direct light coming through inside of the transparent board to the upper side (or under side) of front surface (or back surface) of the transparent board, and to make the convex lens collect the light reflected at the reflecting portion to the optical fiber or the like. Therefore, it is possible to perform modulation or the like on the output light from the photoelectric device, in the case that the light of photoelectric device is emitted toward the upper side above the front surface (bottom side under the back surface) of the transparent board and an optical element, such as a modulator or a filter, is arranged on the front surface (or back surface) of the transparent board.

In addition, an optical communication module according to the present invention is a module, wherein the convex lens is integrally formed on the back surface of the transparent board, the optical communication module comprises a convex portion that is arranged on the front surface of the transparent board to intersects an optical axis of the convex lens, the photoelectric device is aligned with the convex portion on the front surface of the transparent board and is optically connected to the convex portion, and the convex portion works as the reflecting portion that reflects light coming from any one of the photoelectric device and the convex portion to the other one of them.

According to the present invention, the convex portion (reflecting portion) is aligned with the photoelectric device on the front surface of the transparent board, as it performs the reflection with the photoelectric device. Thus, the optical transmission is performed between the photoelectric device and the back surface through the convex portion. For example, when a light emitting element is utilized as the photoelectric device, the light emitted by the photoelectric device is reflected by the convex portion, and passes through the transparent board toward the back surface. Then, the light reflected by the back-surface convex lens of the transparent board can be converted into the substantially parallel light. Therefore, it is possible to prevent the reduction in the performance of optical communication, because substantially all of the light can be emitted as substantially parallel light from the photoelectric device to the back surface of the transparent board.

In addition, an optical communication module according to the present invention is a module, wherein the convex portion is configured to refract light emitted from the photoelectric device for making the refracted light become substantially parallel to the front surface of the transparent board and reflect the refracted light to the back surface, when the photoelectric device is a light emitting element that converts electrical signals into optical signals.

According to the present invention, it is not required to provide plural convex portions on the transparent board, because one convex portion performs the refraction and the reflection. Therefore, it is possible to downsize the optical communication module.

In addition, an optical communication module according to the present invention is a module, wherein the photoelectric device transmits light with the convex lens through the convex portion.

According to the present invention, light emitted from the photoelectric device passes through the convex portion through the transparent board toward the back surface, and reaches to the convex lens arranged on the back surface of the transparent board. Then, the substantially parallel light can be collected at the optical fiber or the like by the convex lens. Thus, the light emitted through the transparent board from the photoelectric device can become the substantially parallel light that is collected at the optical fiber or the like. Therefore, it is possible to stabilize the light in the optical communication and to prevent reduction in the performance of the optical communication.

In addition, an optical communication module according to the present invention is a module, wherein the convex portion and the convex lens are at least partially opposite to each other, and are configured to make light coming from any one of the convex portion and the convex lens to the other one of them through the transparent board become substantially parallel light.

According to the present invention, the shapes of convex portion and convex lens are determined to make the light coming from one of them to the other one of them, i.e., the light passing through the transparent board, become parallel light. Thus, it is possible to collect the light coming from one of them to the other one of them at the photoelectric device or optical fiber, even if the center of convex portion does not match with the center of convex lens. Therefore, it is possible to avoid the deterioration in the communication performance.

In addition, an optical communication module according to the present invention is a module comprising a cylindrical portion which is arranged to surround the convex lens and to protrude from the transparent board and which has a communication line for optical communication fit into the cylindrical portion, wherein the photoelectric device transmits optical signals through the cylindrical portion, the convex portion and the convex lens.

According to the present invention, the cylindrical portion is arranged on the back surface of the transparent board to surround the convex lens. It is configured to fit a communication line, such as an optical fiber, into the cylindrical portion, and to perform the communication of optical signals between the photoelectric device and communication line through the convex lens and convex portion in the cylindrical portion. Thus, the photoelectric device can emit the light to the communication line fit into the cylindrical portion, or receive the light emitted from the communication line.

Hence, it is possible to properly align the position of photoelectric device with the communication line only by fitting the communication line into the cylindrical portion, when the cylindrical portion is formed precisely. Therefore, it is possible to facilitate connection to the optical communication module and communication line, and to enhance the communication performance.

In addition, an optical communication module according to the present invention is a module, wherein a concave portion is formed on the transparent board between the photoelectric device and the convex portion.

According to the present invention, when diffused light is emitted from the photoelectric device, the diffused light is reflected by the front surface of the transparent board between the convex portion and photoelectric device, and the reflected light is directed into the convex portion. Therefore, it is possible to avoid the deterioration of communication performance.

In addition, an optical communication module according to the present invention is a module, wherein a first and second photoelectric devices are arranged with a space on a front surface of the transparent board, comprising: a first convex lens that is integrally formed on the front surface of the transparent board, light being output to or input from the first photoelectric device; a second convex lens that is integrally formed on a back surface of the transparent board and opposite to the photoelectric device; and a third convex lens that is integrally formed on the back surface of the transparent board, light being output to or input from the second photoelectric device, wherein a pair of the reflecting portions is formed inside the transparent board, one of the pair intersects an optical axis of the first convex lens, and the other one of the pair intersects an optical axis of the second convex lens, each of the reflecting portions is configured to reflect light coming from the first or second convex lens to the pair of reflecting portions, and to reflect light coming from the pair of reflecting portions to the first or second convex lens, and the first photoelectric device is configured to send or receive light through the first and second convex lens and the pair of reflecting portions.

According to the present invention, photoelectric devices are arranged with a space in between on the front surface of the transparent board, and the first, second and third convex lenses are integrally formed on the front and back surfaces of the transparent board. In addition, a pair of reflecting portions is arranged in the transparent board, which intersects the optical axes of the first and second convex lens, respectively. Each of these reflecting portions is configured to reflect light coming from the first or second convex lens to the other one of the reflecting portions, and to reflect light coming from the other one of the reflecting portions to the first or second convex lens. Thus, the first photoelectric device can emit light to or receive light from, for example, the optical fiber through the first convex lens, second convex lens and pair of reflecting portions. In addition, the second photoelectric device emits light to or receives light from, for example, the optical fiber through the third convex lens. In short, the second and third convex lenses perform the optical transmission with the optical fiber.

In the case that plural photoelectric devices are arranged, the size of optical communication module is increased, because it is required to keep a space between the arranged photoelectric devices in order to avoid the effect of noise caused by the crosstalk due to the electrical signals. Thus, the reflecting portion is provided for refracting light as described above. Hence, it is possible to narrow the distance between the second and third convex lenses. Therefore, it is possible to downsize the optical communication, because the distance between two optical fibers connected to the second and third convex lenses can be shortened.

In addition, the transparent board, second convex lens and third convex lens are integrally formed of transparent synthetic resin, glass or the like. When plural convex lenses are formed separately, a lens tube and the like are required for supporting each convex lens. However, it is possible to shorten the distance between convex lenses because plural convex lenses are formed integrally.

In addition, an optical communication module according to the present invention is a module, wherein the first and second convex lenses are arranged substantially parallel to an optical axis on the transparent board, and the reflecting portions are reflecting surfaces angled about 45 degrees with respect to a plane direction of the transparent board.

According to the present invention, the optical axes of the first and second convex lenses become substantially parallel, and the reflecting portion becomes the reflecting surface angled about 45 degrees with respect to the plane direction of the transparent board. Thus, when the light emitted from the photoelectric device is converted into the substantially parallel light by the first convex lens, the light coming to the second convex lens from the first convex lens through the reflecting portion becomes the substantially parallel light. Hence, it is possible to prevent the light of light emitting element from affecting another photoelectric device, because the light coming into the second convex lens is prevented from coming into the optical pathway for another photoelectric device. Therefore, it is possible to avoid the deterioration in the communication performance of the optical communication module.

In addition, an optical communication module according to the present invention is a module, wherein the reflecting surfaces are bottom surfaces of concave portions respectively formed on front and back surfaces of the transparent board.

According to the present invention, the concave portions are formed on the front and back surfaces of the transparent board and the bottom surface of each concave portion is the reflecting surface. In other words, cutting of transparent board can provide the reflecting surface. Therefore, it is possible to reduce the number of parts required for the optical communication module and to facilitate the manufacturing process.

In addition, an optical communication module according to the present invention is a module, wherein the first photoelectric device is a light emitting element that emits light converted from electrical signals, and the second photoelectric device is a light receiving element that converts received light into electrical signals.

According to the present invention, it is possible to provide the optical communication module including both of the light emitting element and light receiving element.

In addition, an optical communication module according to the present invention is a module comprising: a first convex lens that is formed on the front surface of the transparent board; a second convex lens that is formed on the back surface of the transparent board; a first reflecting portion having a reflecting surface that is inclined to a plane direction in the transparent board and intersects an optical axis of the first convex lens; a second reflecting portion having a reflecting surface that is arranged in the transparent board, is opposite to the reflecting surface of the first reflecting portion in the plane direction, and is inclined in a direction reverse of the reflecting surface of the first reflecting portion with respect to the plane direction; a third reflecting portion having a reflecting surface that is arranged to protrude from the front surface of the transparent board, is inclined in the same direction as the reflecting surface of the second reflecting portion, and is opposite to a normal direction; a fourth reflecting portion having a reflecting surface that is arranged to incline to and protrude from the front surface of the transparent board, and intersects an optical axis of the second convex lens, wherein light reflected by any one of the third and fourth reflecting portions becomes input light to the other one of them, and light of the photoelectric device comes from any one of the first and second convex lenses to the other of them through the first, second, third and fourth reflecting portions.

According to the present invention, the first and second convex lenses are formed on the front and back surfaces of the transparent board included by the optical communication module. In addition, the photoelectric device is optically connected to and aligned with the first convex lens on the front surface. The light emitted (or received) by the photoelectric device is transmitted between the first and second convex lenses through the transparent board. In the transparent board, the reflecting surface (first reflecting surface) of the first reflecting portion crossing the optical axis of first convex lens is aligned with the reflecting surface (second reflecting surface) of the second reflecting portion opposing to the first reflecting portion and inclining in the direction reverse to the first reflecting surface's direction. In addition, the reflecting surface (third reflecting surface) of the third reflecting portion and the reflecting surface (fourth reflecting surface) of the fourth reflecting portion are arranged to protrude on the front surface of the transparent board. As the third reflecting surface is opposite to the second reflecting surface and is inclined in the same direction as the second reflecting surface's direction and the fourth reflecting surface intersects the optical axis of second convex lens and is inclined with respect to the front surface. It is configured to make the light reflected by any one of the third and fourth reflecting surfaces become the input light to the other one of them.

For example, in the case that the light emitting element is utilized as the photoelectric device, the light emitted by the light emitting element is converted into the substantially parallel light by the first convex lens, reaches to the first reflecting surface and then is reflected toward the second reflecting surface by the first reflecting surface. The reflected light is further reflected toward the third reflecting surface by the second reflecting surface. The light coming to the third reflecting surface is reflected toward the upper side above the front surface of the transparent board by the third reflecting surface, because the third reflecting surface is arranged to protrude on the front surface. The light emitted toward the upper side above the front surface is reflected by the fourth reflecting surface, passes through the transparent board toward the second convex lens, and thus can be collected at the optical fiber and the like by the second convex lens. In other words, the parallel light originally emitted from the light emitting element and directed to the back surface of the transparent board is diverted by the first and second reflecting surfaces and comes toward the front surface side. Then, the light is emitted toward the upper side above the front surface by the third reflecting surface, and passes through the transparent board again toward the back surface by the fourth reflecting surface.

Thus, it is possible to perform the modulation or the like on the light emitted from the photoelectric device, when the light from the first convex lens to the second convex lens becomes the parallel light and is directed toward the upper side of the front surface of the transparent board, as described above, and the optical element, such as modulator or filter, is arranged on the front surface of the transparent board. In addition, when the optical element is arranged on the front surface of the transparent board with the positional adjustment with respect to the parallel light, it is possible to easily and precisely match the connected position of the optical element with the connected positions of photoelectric device and optical fiber. Therefore, it is possible to avoid the deterioration of the communication performance.

In addition, an optical communication module according to the present invention is a module, wherein the first and second convex lenses are formed to make their optical axes intersect the plane direction, and each reflecting surface of the first, second, third and fourth reflecting portions is angled about 45 degrees with respect to the plane direction.

According to the present invention, the optical axes of the first and second convex lenses are perpendicular to the plane direction, and the first, second, third and fourth reflecting surfaces are inclined about 45 degrees with respect to the plate direction. For example, when the light emitted by the photoelectric device is converted into the substantially parallel light by the first convex lens, it is possible to provide the substantially parallel light coming to the second convex lens through the reflecting surface from the first convex lens. Therefore, it is possible to enhance the performance of optical communication.

In addition, an optical communication module according to the present invention is a module, wherein the second convex lens is formed on a parallel line in the plane direction to a line extending along the plane direction and intersecting the reflecting surfaces of the first and second reflecting portions, the reflecting surfaces of the third and fourth reflecting portions are inclined in reverse directions, respectively, along the line direction, the optical communication module further comprises a pair of reflecting surfaces that are arranged oppositely on the front surface of the transparent board, one of these reflecting surfaces is aligned with the reflecting surface of the third reflecting portion and the other one of these reflecting surfaces is aligned with the reflecting surface of the fourth reflecting portion along the line direction, the pair of reflecting surfaces are configured to reflect light, direct light reflected by the third or fourth reflecting portion to the corresponding one of reflecting surfaces, and direct light reflected by the corresponding one of reflecting surfaces to the third or fourth reflecting surface.

According to the present invention, the second convex lens is arranged on the line parallel in the plane direction to the line intersecting the first and second reflecting surfaces along the plane direction. In other words, the third and fourth reflecting surfaces are inclined in the reverse directions to each other along the line direction, whose optical axes of input light (or reflected light) are parallel to the plane direction. Between the third and fourth reflecting surfaces, the pair of reflecting surfaces are arranged opposite to each other. The pair of reflecting surfaces are configured to make the light reflected by the third or fourth reflecting surface come toward a corresponding one of the pair of reflecting surfaces and the light reflected by the corresponding one of the pair of reflecting surfaces come toward the third or fourth reflecting surface. Thus, the light reflected by the third or fourth reflecting surface is refracted linearly at two steps and comes to the other one. Hence, it is possible to increase the path length of light transmitted between the third and fourth reflecting surfaces. Therefore, much more optical elements, such as a modulator, can be arranged between the third and fourth reflecting surfaces.

In addition, an optical communication module according to the present invention is a module further comprising an optical element that is arranged on a pathway of light coming from any one of reflecting surfaces of the third and fourth reflecting portions to the other one of them.

According to the present invention, an optical element, such as a modulator, is arranged between the third and fourth reflecting surfaces. Thus, it is possible to collect the light emitted by the light emitting element at the light collecting optical fiber or the like, with the modulation performed on the emitted light. Therefore, it is possible to provide the optical communication module utilizing the external modulation method in which the external modulator performs the modulation.

In the present invention, it is configured that the photoelectric device mounted on the transparent board performs the optical transmission with the convex lens arranged on the transparent board through the inside of transparent board and the reflecting portion. Therefore, it is possible to implement the accurate optical communication module utilizing the edge emitting type of photoelectric device, the small optical communication module that includes plural photoelectric devices, and the optical communication module in which the optical element can be arranged easily.

In the present invention, it is also possible to make substantially all of the light coming from the photoelectric device to the back surface of the transparent board become the substantially parallel light, even when the photoelectric device is configured as the edge emitting type to transmit light along the front surface of the transparent board. Therefore, it is possible to avoid reduction in the performance of optical communication. In addition, when the convex lenses (convex portions) are integrally formed on the front and back surfaces, it is possible to make the light coming from any one of convex lens (convex portion) become the parallel light at the time of passing through the transparent board. Thus, even when different mold tools are utilized to form the front and back surfaces of the transparent board and the center of lens on one side of the transparent board mismatches with the center of another lens on the other side of the transparent board because of improper positioning of two mold tools, it is possible to collect the light emitted from the convex portion on the front surface at the photoelectric device, or collect the light emitted from the convex lens on the back surface at the optical fiber. Therefore, it is possible in the optical communication module of the present invention to avoid deterioration in communication performance, even when the positioning of two convex lenses (convex portions) is not good.

In the case that plural photoelectric devices are arranged, the space should be kept between the arranged photoelectric devices, in order to avoid the effect of noise caused by the crosstalk due to the electrical signals, and thus the size of optical communication module is increased. Hence, in the present invention, the reflecting portion is provided as described above to refract the light, and the distance between the second and third convex lenses can be shorten. Therefore, it is possible to downsize the optical communication module, because the distance between two optical fibers respectively connected to the second and third convex lens can be shortened (the pitch is shortened). For example, when two optical fibers are bound into one optical cable, the shortening of pitch between the optical fibers contributes to reduce the cost of the optical cable, the relay connector for the optical cables, and the like.

In the present invention, it is also possible to make the light from the first convex lens to the second convex lens become the parallel light, and then to emit the light toward the upper side above the front surface of the transparent board. Thus, it is possible to perform the modulation on the output light from the photoelectric device when an optical element, such as a modulator or a filter, is arranged on the transparent board. In addition, it is possible to easily and precisely match the connected position of the optical element with the connected positions of photoelectric device and optical fiber, when the position of optical element is adjusted with respect to the parallel light and arranged on the front surface of the transparent board. Therefore, it is possible to avoid the deterioration of the communication performance.

The above and further objects and features of the invention will more fully be apparent from the following detailed description with accompanying drawings.

BRIEF DESCRIPTION OF THE DRAWINGS

FIG. 3 is a schematic view for illustrating configurations of a first lens and a second lens included in the optical communication module according to the embodiment 1 of the present invention.

FIG. 4 is a schematic view showing a configuration of the first lens in the optical communication module according to a variation for the embodiment 1 of the present invention.

FIG. 13 is a schematic view for explaining light transmitted between the laser diode and the optical fiber.

DESCRIPTION OF THE PREFERRED EMBODIMENTS

Embodiment 1

Figure 1:
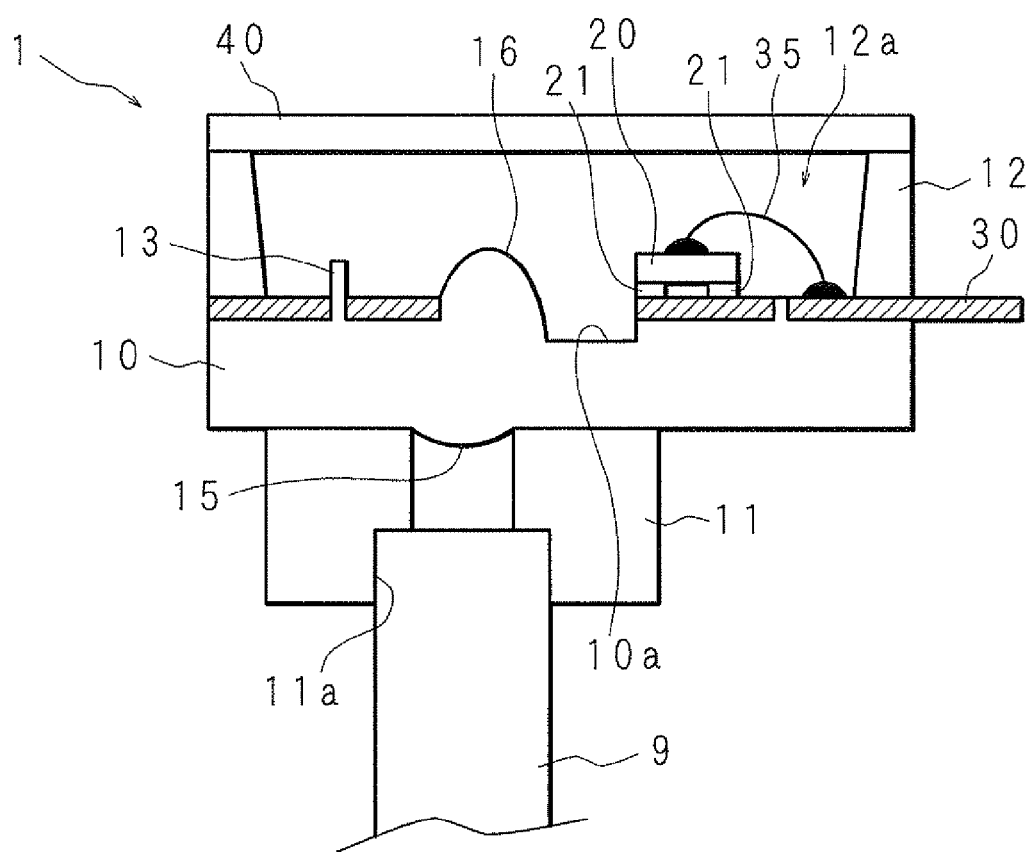
FIG. 1 is a schematic cross section view showing a configuration of an optical communication module according to an embodiment 1 of the present invention.

The present invention will be described in reference to figures that show Embodiments according to the present invention. FIG. 1 is a schematic cross section view showing a configuration of an optical communication module according to an embodiment 1 of the present invention. The reference numeral "1" in figures is an OSA into which a laser diode (photoelectric conversion device) 20 is packaged, and which corresponds to the optical communication module according to the present invention. The OSA 1 is a part that is connected to an optical fiber (communication line) 9 and outputs an optical signal, converted by the laser diode 20 from an electrical signal, to another device through the optical fiber 9 for the optical communication.

The OSA 1 includes a basement (transparent board) 10 whose shape in a plan view is substantially square and which is made of synthetic resin that passes light. A laser diode (photoelectric device) 20 is connected on one surface of the basement 10 (upper surface [front surface] in FIG. 1, hereinafter called as the upper surface, simply), and a cylindrical portion 11 for connecting an optical fiber (communication line) 9 is arranged on the other surface (lower surface [back surface] in FIG. 1, hereinafter called as the lower surface, simply). A peripheral wall 12 is arranged on the upper surface of the basement 10 to follow the outer perimeter of the peripheral portion. The upper surface of basement 10 and the peripheral wall 12 configure a recess portion 12a that accommodates the laser diode 20.

The laser diode 20 is an edge-emitting laser, and the shape in plan view is a substantially square plate. The laser diode 20 has a light emitting portion on the side surface, and one or more connection terminals 21 on the lower surface. The connection terminal 21 is for inputting and outputting electrical signals of the laser diode 20, and for connecting the laser diode 20 to the conductive plate 30 with solder, conductive adhesive or the like. In the present embodiment, it is configured that another connection terminal (not shown in figures) is arranged on the upper surface of the laser diode 20 and the connection terminal on the upper surface is electrically connected to the conductive plate 30 with a metal wire 35.

For example, two connection terminals may be arranged on the lower surface of laser diode 20. In this example case, each of connection terminals may be substantially formed in a rectangle shape and arranged with the light emitting portions of them between the connection terminals. For example, it may be further provided with a dummy connection terminal only for the connection with solder, conductive adhesive or the like which neither performs the input nor output of electrical signals, in addition to the two connection terminals for inputting and outputting electrical signals. In this example case, four connection terminals may be arranged at the four corners on the lower surface of laser diode 20, respectively.

The conductive plate 30 made of metal is embedded in the basement 10 of the OSA 1 so as to expose one surface thereof in the recess portion 12a. The exposed portion of the conductive plate 30 in the recess portion 12a is connected to the connection terminal 21 of the laser diode 20 with solder, conductive adhesive or the like, or connected through the wire 35 to a terminal arranged on the upper surface of laser diode 20, to transmit electrical signals between the laser diode 20 and the outside. In other words, the conductive plate 30 works in a sending circuit including the laser diode 20 as a wiring for connecting circuit components.

Figure 2:
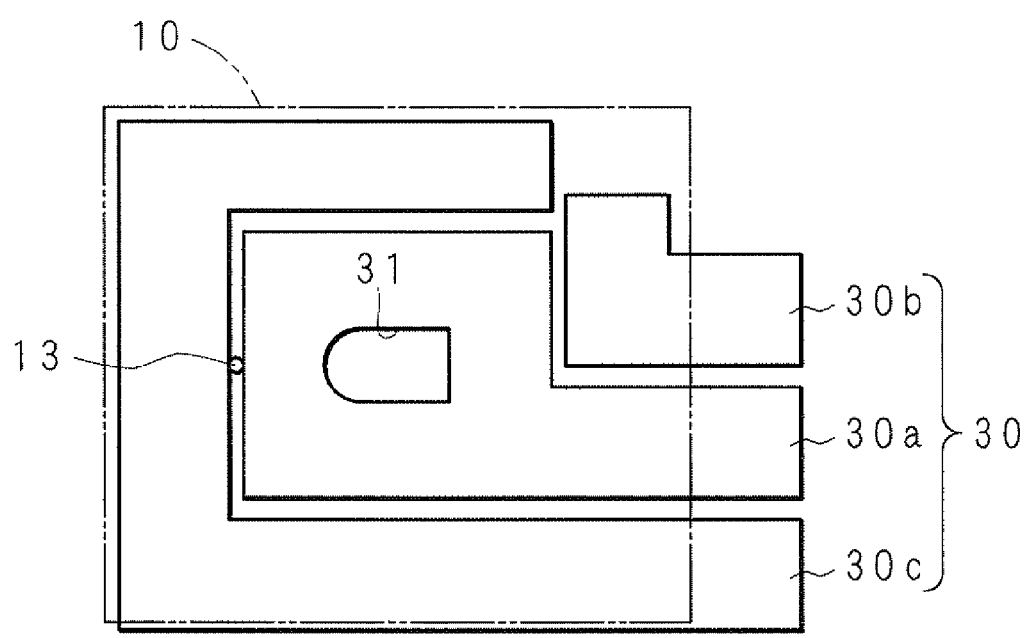
FIG. 2 is a schematic plane view showing a configuration of a conductive plate included in the optical communication module according to the embodiment 1 of the present invention.

FIG. 2 is a schematic plane view showing a configuration of the conductive plate 30 included in the optical communication module according to the embodiment 1 of the present invention. The outer shape of basement 10 is represented by the broken line and overlaid on the shape of conductive plate 30 viewed from the upper surface side.

In the illustrated example, OSA 1 includes three conductive plates 30a-30c. The first conductive plate 30a is configured with a substantially square portion arranged at the center of basement 10 and a portion extending from the square portion to the outside of basement 10. An opening 31 is formed at the substantial center of the square portion, and works as a light passing portion that passes light. The opening 31 is a rectangle whose one end potion is substantially semicircular. The first conductive plate 30a is embedded in the basement 10 and the center of the semicircular portion of opening 31 matches with the center of first lens (convex portion, reflecting portion) 16 of the basement 10, described later. The semicircular portion of opening 31 is configured to have a size the same as or a little larger than the diameter of first lens 16. The connection terminal 21 of the laser diode 20 is connected to the portion around the opening 31 of the first conductive plate 30a with soft solder or conductive adhesive.

The second conductive plate 30b is substantially formed in an "L" shape and aligned with the first conductive plate 30a, to make its one end portion extend to the outside of basement 10. The second conductive plate 30b is connected through the wire 35 to the terminal arranged on the upper surface of laser diode 20. The third conductive plate 30c is substantially formed in a "U" shape, and arranged to surround the first conductive plate 30a, with its one end portion extending to the outside of basement 10. The third conductive plate 30c is utilized for shielding the OSA 1, for example, as connected to ground. The portions of conductive plates 30a-30c extending from the basement 10 are utilized as terminals for connecting the OSA 1, for example, with a circuit board of a communication apparatus.

The basement 10 of the OSA 1 includes a position setting portion 13 formed in a round rod shape and arranged to protrude on the upper surface within the recess portion 12a. The position setting portion 13 is utilized as a reference for the positional determination of the laser diode 20 when connected to the conductive plate 30 (particularly, the conductive plate 30a) within the recess portion 12a, and is arranged with a precisely determined distance set from the center of semicircular portion of the opening 31 of the conductive plate 30 supported by the basement 10 (or the distance from the center of first lens 16 described later). Manufacturing equipment connecting the laser diode 20 with the conductive plate 30 may capture an image viewed from the upper surface of the basement 10, for example, by a camera, utilize the position of position setting portion 13 as the reference, and connect the laser diode 20 to a position apart from the position setting portion 13 in a predetermined direction and by a predetermined distance.

The first lens (convex portion, reflecting portion) 16 is arranged on the upper surface of basement 10 supporting the conductive plate 30, and substantially formed in a circular shape continuing to the opening 31 of the conductive plate 30. The shape of first lens 16 is convex, protruding upward. The first lens 16 is aligned with the laser diode 20, and receives incident light from the side surface of laser diode 20. The first lens 16 is configured to refract the incident light from the laser diode 20 to be substantially parallel light along the upper surface of basement 10, and reflect the refracted light to come downwardly in the vertical direction. The light refracted and reflected by the first lens 16 becomes the parallel light and then reaches to the second lens (convex lens) 15.

A concave portion 10a is configured between the first lens 16 and laser diode 20 on the upper surface of basement 10. The light emitted from the laser diode 20 broadens with a predetermined range. However, it is possible to prevent the light emitted by the laser diode 20 and reflected by the front surface of the basement 10 from coming into the first lens 16, because the concave portion 10a is kept between the first lens 16 and laser diode 20 and lower than the front surface.

The convex second lens (convex lens) 15 is arranged on the lower surface of basement 10. In the vertical direction, the center of the second lens 15 does not match with the center of the first lens 16 arranged on the upper surface of basement 10. In addition, the second lens 15 is arranged to at least partially overlap with the first lens 16. The second lens 15 is configured to collect the light (parallel light), refracted by the first lens 16 and passing through the basement 10, at the optical fiber 9 held under the second lens 15. It should be noted that the center of the second lens 15 may match with the center of the first lens 16.

The basement 10, peripheral wall 12, position setting portion 13, second lens 15 and first lens 16 are made of transparent synthetic resin and formed integrally in the OSA 1. For example, the integral formation can be obtained by so-called injection molding, in which the conductive plate 30 machined to have a predetermined shape is put in a mold tool and then liquid transparent resin is poured into it and cured. Because the basement 10 is made of transparent resin, the laser diode 20 connected to the conductive plate 30 can emit light to the outside through the first lens 16, transparent basement 10 and second lens 15. In addition, the transparent synthetic resin for forming the basement 10 and so on can be selected regardless of the heat resistance of laser diode 20 or the like. Therefore, it is possible to select synthetic resin contributing in highly precise formation and avoiding the deformation caused by environmental change, such as temperature change.

The cylindrical portion 11 of the OSA 1 is cylindrical, surrounds the second lens 15 arranged on the lower surface of basement 10, and is connected to the lower surface of basement 10. The inner diameter of cylindrical portion 11 is expanded stepwisely and downwardly. Thus, the inner diameter at the upper portion is smaller and the inner diameter at the lower portion is larger. The smaller inner diameter at the upper portion of the cylindrical portion 11 is equal to or a little larger than the diameter of the second lens 15. The larger inner diameter at the lower portion of the cylindrical portion 11 is substantially equal to the diameter of optical fiber 9. Thus, a fitting portion 11a is configured to receive the optical fiber 9 therein.

The cylindrical portion 11 may be made of synthetic resin or another material such as metal, wood or the like. The cylindrical portion 11 may be fixed with a connection pin (not shown in figures) inserted into a connection hole (not shown in figures) of the basement 10, or with adhesive.

The OSA 1 further includes a cover 40 that is connected on the upper end of peripheral wall 12 arranged at the upper surface side of the basement 10 and seals the recess portion 12a. The cover 40 is a plate whose shape is substantially square in a plan view, which is the same as the basement 10, and is connected to the upper end of peripheral wall 12, for example, by ultrasonic welding method or adherence method with adhesive. The cover 40 may be transparent or non-transparent, and made of material the same as or different from those of basement 10, peripheral wall 12 and so on. It should be noted that nitrogen gas, dry air or the like may be injected into the recess portion 12a or the inside of recess portion 12a may be vacuumed, at the time of connecting the cover 40.

Two of fixed mold tools are utilized for forming the basement 10 of OSA 1. One of them has a concavity and convexity for forming the upper surface of basement 10, the peripheral wall 12, the positioning portion 13, the first lens 16 and the like of the OSA 1, and the other one of them has a concavity and convexity for forming the lower surface of basement 10, second lens 15 and the like of the OSA 1. At first, two mold tools are vertically combined to be in contact with each other, and transparent liquid synthetic resin is poured into the formed concavo-convex space and then cured. Thus, the basement 10, peripheral wall 12, position setting portion 13, first lens 16, second lens 15 and the like are formed integrally.

FIG. 3 is a schematic view for explaining configurations of the first lens 16 and second lens 15 included in the optical communication module according to the embodiment 1 of the present invention. In FIG. 3, only the basement 10, second lens 15, first lens 16 and laser diode 20 are selected and shown schematically.

The light emitted from the laser diode 20 broadens with a predetermined range and reaches to the first lens 16. The first lens 16 has the convex surface whose shape is determined to convert the light emitted from the laser diode 20 into the substantially parallel light, in consideration of the distance to the laser diode 20. Thus, the light emitted from the laser diode 20 is converted into the substantially parallel light by the first lens 16, passes through the transparent basement 10, and reaches to the second lens 15. The second lens 15 has the convex surface whose shape is determined to collect the substantially parallel light coming through the basement 10 at the optical fiber 9 (A point), in consideration of the distance to the optical fiber 9.

In the present embodiment, the center of the second lens 15 does not match with the center of the first lens 16. However, the light emitted from the laser diode 20 and coming to the first lens 16 is converted into the substantially parallel light by the first lens 16, passes through the basement 10, and then reaches to the second lens 15. The light reaching at the second lens 15 is collected at the optical fiber 9.

Thus, the light emitted from the laser diode 20 is converted into the substantially parallel light by the first lens 16 and passes through the basement 10, regardless of whether the center of the second lens 15 matches with the center of the first lens 16 or not. Then, the light reaching at the second lens 15 can be collected at the optical fiber 9. Hence, the OSA 1 according to the present invention can surely collect the light emitted from the laser diode 20 at the optical fiber 9, even in the case that the edge-emitting laser is utilized as the laser diode 20. Therefore, it is possible to avoid the deterioration in the optical communication performance caused by the aberration.

The OSA 1 described above can collect the light emitted from the laser diode 20 at the optical fiber 9 through the first lens 16, the basement 10, the second lens 15 and the inside of cylindrical portion 11. In addition, the first lens 16 can convert the light emitted from the laser diode 20 into the substantially parallel light, and the second lens 15 can collect the substantially parallel light at the optical fiber 9. Thus, the optical fiber 9 can surely receive the light, even when the center of the second lens 15 does not match with the center of the first lens 16. Therefore, it is possible to avoid the reduction in the optical communication performance.

It is configured that the laser diode 20 is sealed by the cover 40 connected to the recess portion 12a. Thus, the high precision is not required for the connection of the cover 40. Therefore, it is possible to seal the laser diode 20 with an easy method and at a low cost. In addition, it is configured that the positioning setting portion 13 is arranged to protrude within the recess portion 12a on the upper surface of basement 10. Because the position setting portion 13 can be formed precisely and integrally with the basement 10, it is possible to easily and accurately connect the laser diode 20 to the conductive plate 30 with reference to the position setting portion 13.

The cylindrical portion 11 is connected to surround the second lens 15 on the lower surface of basement 10, and the optical fiber 9 is fit into the tip end of cylindrical portion 11. Because the cylindrical portion 11 can be accurately connected to the basement 10, it is possible to decide the positions of the second lens 15 and optical fiber 9, easily and precisely. Furthermore, the optical fiber 9 can surely collect the light at the second lens 15.

Although the OSA 1 is illustrated to include the laser diode 20 as the photoelectric device and to emit light, the present invention is not limited to the illustration. A photodiode may be included as the photoelectric device, for receiving light. In addition, although the OSA 1 is illustrated to include one photoelectric device within the recess portion 12a, the present invention is not limited to the illustration. Plural photoelectric device may alternatively be included. When both of the photoelectric devices, i.e., photodiode and laser diode, are arranged in the alternative case, the OSA can emit and receive light to perform the transmission of optical signals. In addition, the OSA 1 may include another lens for collecting light, instead of the second lens 15 on the lower surface of basement 10 for collecting light at the optical fiber 9. In the last case, it is not required to form two lenses on the basement 10, and thus it does not cause the positional aberration for these lenses. Therefore, it is possible to avoid reduction in the optical communication performance at the basement 10.

The configuration of the conductive plate 30 (30a-30c) shown in FIG. 2 is an example, and the present invention is not limited to the example. Although it is illustrated that a terminal on the upper surface of laser diode 20 is connected with the wire 35 to the conductive plate 30, the present invention is not limited to the illustration. The wire 35 may not be utilized for the connection, when plural connection terminals 21 are provided on the lower surface of laser diode 20.

Though it is illustrated that the position setting portion 13 is arranged on the upper surface of basement 10 to be utilized as the reference for the positional determination of the laser diode 20, the present invention is not limited to the illustration. The OSA 1 may not include the position setting portion 13, but may utilize another portion on the upper surface of basement 10 as the reference for the positional determination of the laser diode 20.

It is illustrated that the peripheral wall 12 is arranged on the upper surface of basement 10 to configure the recess portion 12a and the cover 40 seals the recess portion 12a to seal the laser diode 20. However, the present invention is not limited to the illustration. Another configuration such as resin sealing on the laser diode 20 may be utilized for the sealing. In addition, although it is illustrated to accommodate only the laser diode 20 within the recess portion 12a, the present invention is not limited to the illustration. It may accommodate another circuit component configuring the electrical circuit (resistance, capacitor, coil, IC [integrated circuit] or the like) within the recess portion 12a.

(Variation)

Although the first lens 16 is illustrated to be substantially circular, the present invention is not limited to the illustration. The first lens 16 has the shape that can surely convert the light emitted from the laser diode 20 into the parallel light. FIG. 4 is a schematic view showing a configuration of the first lens 16 in the optical communication module according to a variation for the embodiment 1 of the present invention. The first lens 16 in the variation is formed to have an entrance surface 16a into which the light from laser diode 20 enters and a reflecting surface 16b that reflects the entered light. The entrance surface 16a is formed to be substantially circular and convex toward the side of the laser diode 20, and converts the light coming from the laser diode 20 into the parallel light. The reflecting surface 16b is formed to be angled about 45 degrees with respect to the surface of basement 10, and reflects the parallel light converted by the entrance surface 16a to direct downwardly in the vertical direction. Thus, it is possible to accurately perform the optical communication. In this configuration, two fixed mold tools may be utilized for the formation. If such a fixed mold tool cannot be utilized because of the shape of the first lens 16, a slide mold tool may be utilized.

It may be configured that the first lens 16 of the variation has the reflecting surface (convex portion) 16b for reflecting the entered light, but does not have the entrance surface 16a. In this configuration, the light coming from the laser diode 20 is reflected by the reflecting surface 16b to be directed toward the second lens 15, the second lens 15 converts the light reflected by the reflecting surface 16b into the substantially parallel light. Another lens is further provided in the OSA 1 for collecting light, separately from the basement 10. In the configuration, it is not required to form two lenses on the basement 10. Therefore, it is possible to avoid the positional aberration between lenses and to avoid the reduction in the optical communication performance.

Embodiment 2

Figure 5:
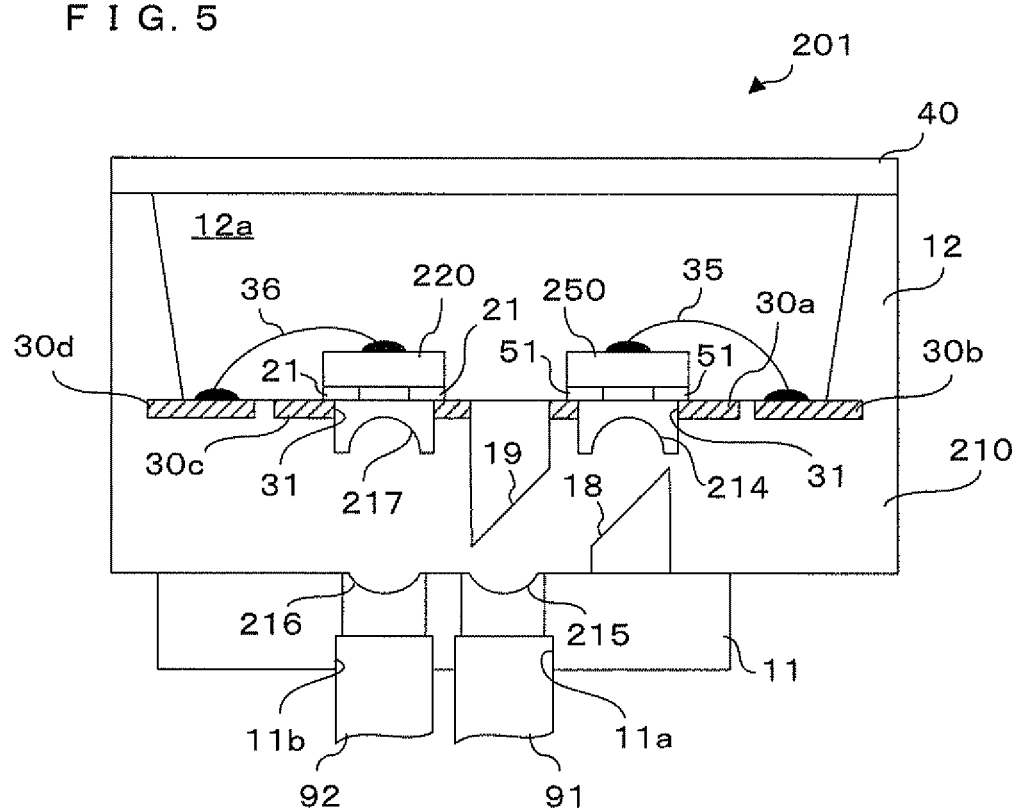
FIG. 5 is a schematic cross section view showing a configuration of the optical communication module according to an embodiment 2 of the present invention.
Figure 6:
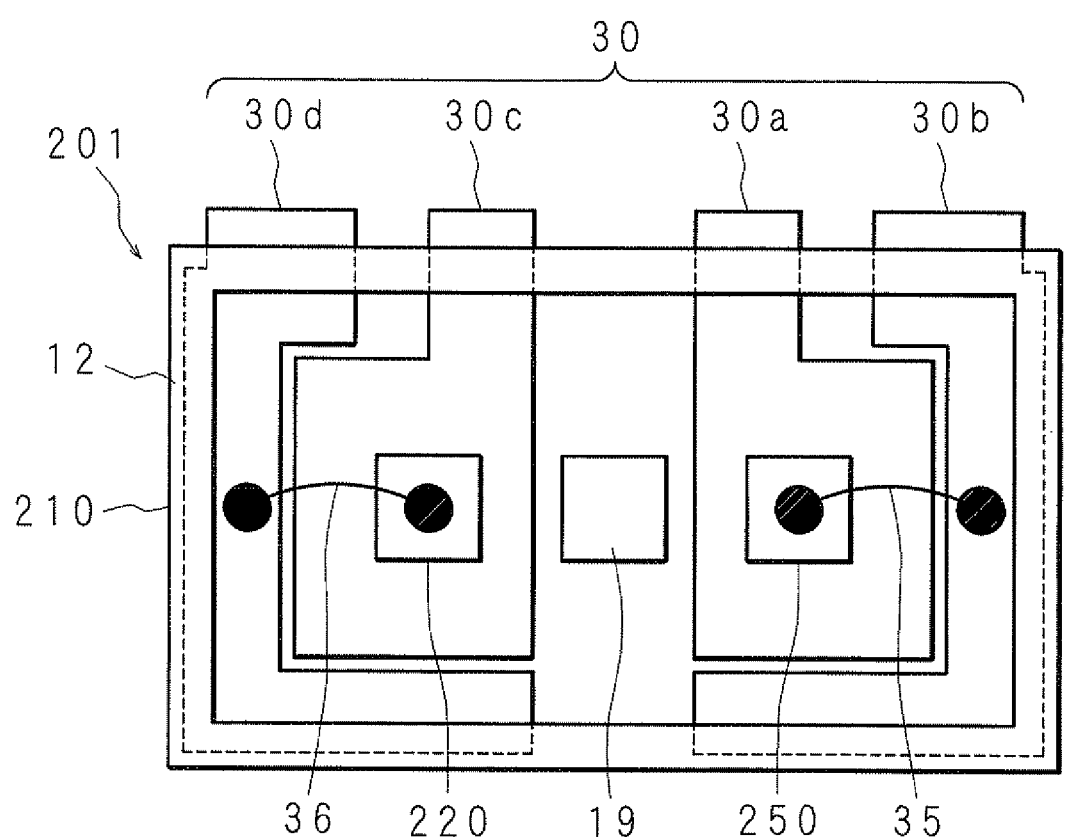
FIG. 6 is a schematic plane view showing a configuration of the optical communication module according to the embodiment 2 of the present invention.

FIG. 5 is a schematic cross section view showing a configuration of the optical communication module according to an embodiment 2 of the present invention. FIG. 6 is a schematic plane view showing a configuration of the optical communication module according to the embodiment 2 of the present invention, in which a cover (described later) of the optical communication module is not attached in the shown configuration.

The reference numeral "201" represents an OSA that is configured to be one unit containing a photodiode (second photoelectric device) 220 and a laser diode (first photoelectric device) 250, and corresponds to the optical communication module according to the present invention. The OSA 201 includes a platy basement 210 whose shape in a plan view is substantially rectangle, and the basement 210 is made of synthetic resin that passes light. The photodiode 220 and laser diode 250 are connected to one surface of basement 210 (the surface at the upper side [front surface] in FIG. 5, hereinafter called as the upper surface, simply), and the cylindrical portion 11 for connecting the optical fibers 91, 92 is arranged on the opposite side surface of basement 210 (the surface at the lower side [back surface] in FIG. 5, hereinafter called as the lower surface, simply). The peripheral wall 12 is arranged on the upper surface of basement 210 to follow the outer perimeter of the peripheral portion. The upper surface of basement 210 and the peripheral wall 12 configure a recess portion 12a that accommodates the photodiode 220 and laser diode 250.

Figure 7A:
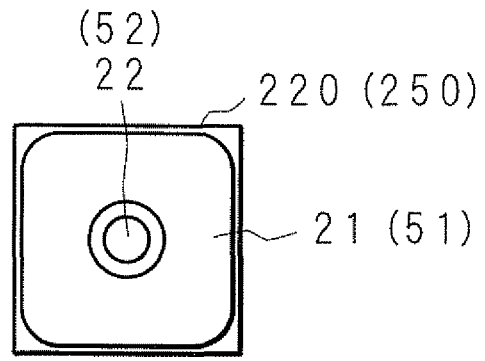
FIG. 7A is a schematic view showing configurations of a photodiode and a laser diode included in the optical communication module according to the embodiment 2 of the present invention.
Figure 7B:
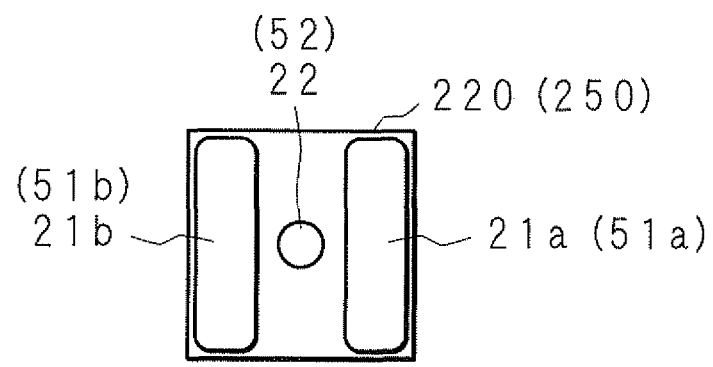
FIG. 7B is a schematic view showing another configurations of the photodiode and the laser diode included in the optical communication module according to the embodiment 2 of the present invention.
Figure 7C:
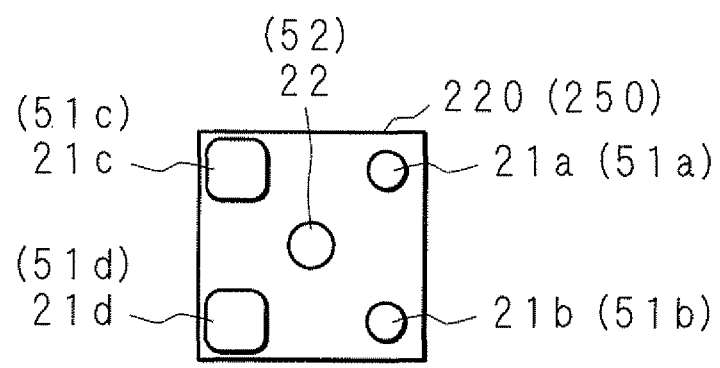
FIG. 7C is a schematic view showing another configurations of the photodiode and the laser diode included in the optical communication module according to the embodiment 2 of the present invention.

FIG. 7A-FIG. 7C are schematic views showing configurations of the photodiode 220 and the laser diode 250 included in the optical communication module according to the embodiment 2 of the present invention. Three alternative configurations viewed from the lower surface side are illustrated in FIG. 7A-FIG. 7C. As the laser diode 250 is configured similarly to the photodiode 220, the laser diode 250 is represented by the parenthetical reference numeral in FIG. 7A-FIG. 7C.

The photodiode 220 (laser diode 250) is a plate whose shape in a plan view is substantially square, and includes a light receiving portion 22 that detects light and then converts it into electrical signals (light emitting portion 52 that emits light in response to electrical signals) at substantially the center on the lower surface, and one or more connection terminals 21 (51) arranged around the light receiving portion 22 (light emitting portion 52). The connection terminal 21 (51) is a terminal for inputting and outputting electrical signals for the photodiode 220 (laser diode 250), and for connecting to the conductive plate 30 with solder, conductive adhesive or the like.

For example, the connection terminal 21 (51) can be annular (see FIG. 7A) to surround the light receiving portion 22 (light emitting portion 52). Although only one connection terminal 21 (51) can be arranged on the lower surface in this alternative embodiment, the photodiode 220 (laser diode 250) requires two terminals for input and output. Thus, it is required to provide another connection terminal on the upper surface or side surface. In the present embodiment, another connection terminal (not shown in figures) is arranged on the upper surface of photodiode 220 (laser diode 250), and electrically connected to the conductive plate 30 with a metal wire 36 (35).

For example, it may be alternatively configured (see FIG. 7B) that two connection terminals 21a, 21b (51a, 51b) are provided on the lower surface of photodiode 220 (laser diode 250). In this alternative configuration, each of connection terminals 21a, 21b (51a, 51b) can be substantially rectangular and they can be arranged to sandwich the light receiving portion 22 (light emitting portion 52). For example, it may be alternatively configured (see FIG. 7C) that dummy connection terminals 21c, 21d (51c, 51d) are provided for the connection with solder, conductive adhesive or the like, without performing the input and output of electrical signals, in addition to the two connection terminals 21a, 21b (51a, 51b) for inputting and outputting electrical signals. In this alternative configuration, these four connection terminals 21a-21d (51a-51d) can be arranged at the four corners on the lower surface of photodiode 220 (laser diode 250).

It should be noted that the following explanation and figures are for the configuration of OSA 201 including the photodiode 220 and laser diode 250 which are shown in FIG. 7A.

The metal conductive plate 30 (30a-30d) is embedded in the basement 210 of the OSA 201, so as to have one surface exposed. The connection terminal 21 of the photodiode 220 and the connection terminal 51 of the laser diode 250 are connected with solder, conductive adhesive or the like to the portion of conductive plate 30 exposed in the recess portion 12a, while terminals arranged on the upper surfaces or the like of photodiode 220 and laser diode 250 are connected to the conductive plate 30 through the wires 35, 36. The photodiode 220 is arranged in line with and apart from the laser diode 250 in the longitudinal direction of the basement 10 within the recess portion 12a, in order to avoid the crosstalk caused by the electrical signals. The conductive plate 30 is utilized for making the photodiode 220 and laser diode 250 perform the transmission of electrical signals with the outside. In other words, the conductive plate 30 works as the wiring that connects circuit components in the communication circuit containing the photodiode 220 and laser diode 250.

The OSA 201 of the embodiment 2 includes four conductive plates 30a-30d. The first conductive plate 30a and second conductive plate 30b are connected to the laser diode 250, whereas the third conductive plate 30c and fourth conductive plate 30d are connected to the photodiode 220. The first conductive plate 30a and third conductive plate 30c are aligned in the longitudinal direction of basement 210, and each plate includes a substantially square portion having a circular opening 31 (see FIG. 5) and a portion extending from the square portion to the outside of longer side of the basement 210. The diameter of opening 31 is shorter than one side of each lower surface of the photodiode 220 and laser diode 250, but longer than the diameter of light receiving portion 22 of the photodiode 220 and than the diameter of light emitting portion 52 of the laser diode 250. The connection terminal 51 of the laser diode 250 is connected to the peripheral portion of opening 31 of the first conductive plate 30a with solder or conductive adhesive, while the connection terminal 21 of the photodiode 220 is connected to the peripheral portion of opening 31 of the third conductive plate 30 with solder or conductive adhesive.

The second conductive plate 30b and fourth conductive plate 30d are arranged along the periphery of basement 10 to surround the first conductive plate 30a and third conductive plate 30c, respectively, and one end of each plate is extending from the long side of basement 210 to the outside. The second conductive plate 30b is connected through the wire 35 to the terminal arranged on the upper surface of laser diode 250, and the fourth conductive plate 30d is connected through the wire 36 to the terminal arranged on the upper surface of photodiode 220.

Each of four conductive plates 30a-30d has the end portion extending from a long side of basement 210. The extending portion is utilized as a terminal for connecting the OSA 201, for example, to a circuit board of a communication apparatus. The communication apparatus including the OSA 201 can detect the voltage or current between the first conductive plate 30a and second conductive plate 30b to receive optical signals, and can apply a predetermined voltage between the third conductive plate 30c and fourth conductive plate 30c to send optical signals.

A substantially-circular concave portion is formed on the upper surface of the basement 210 supporting the conductive plate 30, and continues to the opening 31 of each of the conductive plates 30a, 30c. A first lens surface (first convex lens) 214 and fourth lens surface 217 are arranged on the bottom part of the convex portions, and configured to protrude upwardly. The center of light receiving portion 22 (light emitting portion 52) of the photodiode 220 (laser diode 250) arranged on the basement 210 matches with the center of the fourth lens surface 217 (first lens surface 214).

A third lens surface (third convex lens) 216 is arranged to protrude downwardly on the lower surface of basement 210. The optical axis of the third lens surface 216 is made substantially equal to the optical axis of the fourth lens surface 217. Under the third lens surface 216, the cylindrical portion 11 holds the optical fiber 92. The third lens surface 216 is formed to convert the light emitted from the optical fiber 92 into the substantially parallel light. Light is converted by the third lens surface 216 into the substantially parallel light passing through the transparent basement 10, and then enters the fourth lens surface 217. The fourth lens surface 217 is formed to collect the entered parallel light at the light receiving portion 22 of the photodiode 220. In short, it is configured that the light emitted from the optical fiber 92 passes through the third lens surface 216, the inside of basement 210 and the fourth lens surface 217, and reaches the photodiode 220.

It may be alternatively configured that a laser diode is utilized as the photodiode 220 in the OSA 201. The fourth lens surface 217 may convert the light emitted from the laser diode into the parallel light and the third lens surface 216 collects the parallel light at the optical fiber 92.

On the lower surface of basement 210, the second lens surface (second convex lens) 215 is provided in line with the third lens surface 216. The second lens surface 215 is opposite to a portion between the photodiode 220 and laser diode 250 that are spaced apart from each other, and the optical axis of second lens surface 215 is substantially parallel to the optical axis of first lens surface 214. In addition, reflecting surfaces (reflecting portions) 18, 19 are provided in the basement 210. They are arranged on the optical axes of the first lens surface 214 and the second lens surface 215, respectively, to be facing and in parallel with each other. Particularly, a substantially rectangular (or circular) concave portion is formed on the lower surface of basement 210, and the bottom surface of the concave portion is angled about 45 degrees with respect to the plane direction of basement 210, to provide the reflecting surface 18 in the basement 210. In addition, a rectangular (or circular) concave portion is formed between the conductive plate 30a and 30c on the upper surface of basement 210 (see FIG. 6). The bottom surface of the concave portion is angled about 45 degrees with respect to the plane direction of basement 210, to provide the reflecting surface 19 in the basement 210. In short, the reflecting surfaces 18, 19 intersect with the optical axes of the first lens surface 214 and second lens surface 215 at about 45 degrees.

The first lens surface 214 is formed to receive the light emitted by the laser diode 250 and to convert the entered light into the substantially parallel light. The reflecting surface 18 is formed to reflect the substantially parallel light toward the reflecting surface 19, as the substantially parallel light has been converted by the first lens surface 214 and has passed through the transparent basement 210. The reflecting surface 19 is configured to reflect the substantially parallel light, reflected by the reflecting surface 18, toward the second lens surface 215. The optical fiber 91 is held by the cylindrical portion 11 under the second lens surface 215, and the second lens surface 215 is configured to collect the substantially parallel light, reflected by the reflecting surface 19, at the optical fiber 91.

The basement 210 of OSA 201, the peripheral wall 12, each of lens surfaces 214, 215, 216, 217, the reflecting surfaces 18, 19 and the like are integrally formed of transparent synthetic resin. For example, so-called injection molding can be utilized for the integral formation, i.e., a conductive plate 30 is previously formed in a predetermined shape and put in a mold tool, and transparent liquid resin is poured into the mold tool to cure, in order to manufacture the OSA 201. After the integral formation with the synthetic resin is conducted, the photodiode 220 and laser diode 250 are connected to the conductive plate 30 exposed to the basement 210. Thus, it is possible to select the synthetic resin for forming the basement 210, peripheral wall 12 and so on, regardless of heat resistance and the like of the photodiode 220 and laser diode 250. Therefore, it is possible to select the synthetic resin that has a higher formability and is hardly deformed in response to the peripheral environment, such as temperature change.

It is preferred that the synthetic resin for integrally forming the basement 210 and so on has the refraction index of about 1.5. In the preferred case, the critical angle of reflecting surfaces 18, 19 is represented by $\sin(-1(1/1.5))=41.8$, and thus it is possible to reflect the light at about 45 degrees.

The cylindrical portion 11 of OSA 201 is cylindrical and connected to the lower surface of basement 210 so as to surround the second lens surface 215 and third lens surface 216 arranged on the lower surface of basement 210. The inner diameter of cylindrical portion 11 is expanded stepwisely and downwardly. Thus, the inner diameter at the upper portion is smaller and the inner diameter at the lower portion is larger. The smaller inner diameter at the upper portion is equal to or a little larger than each diameter of the second lens surface 215 and third lens surface 216. The larger inner diameter at the lower portion is substantially equal to each diameter of optical fibers 91, 92. Thus, it configures fitting portions 11a, 11b into which the optical fibers 91, 92 are fit.

The cylindrical portion 11 may be made of synthetic resin or another material such as metal, wood or the like. The cylindrical portion 11 may be fixed with a connection pin (not shown in figures) inserted into a connection hole (not shown in figures) of the basement 210, or with adhesive.

The OA 201 is connected to the upper end of peripheral wall 12 arranged at the upper surface side of basement 210, and includes a cover 40 that seals the recess portion 12a. The cover 40 is a plate whose shape is substantially rectangular in a plan view as in the basement 210, and is connected to the upper end of peripheral wall 12, for example, by an ultrasonic welding method or adherence method with adhesive. The cover 40 may be transparent or non-transparent, and made of material the same as or different from those of basement 210, peripheral wall 12 and so on. It should be noted that nitrogen gas, dry air or the like may be injected within the recess portion 12a or the inside of recess portion 12a may be vacuumed, at the time of connecting the cover 40.

The OSA 201 of the present invention is mounted on a circuit board of a communication apparatus or the like, and supported by the cylindrical portion 11 such that the second lens surface 215 and the third lens surface 216 are respectively arranged, facing each other, on the end surfaces of sending optical fiber 91 and receiving optical fiber 92 as shown in FIG. 5. The end surfaces of sending optical fiber 91 and receiving optical fiber 92 are aligned with each other and fixed to be opposite to the second lens surface 215 and third lens surface 216 of the OSA 201, respectively.

Figure 8:
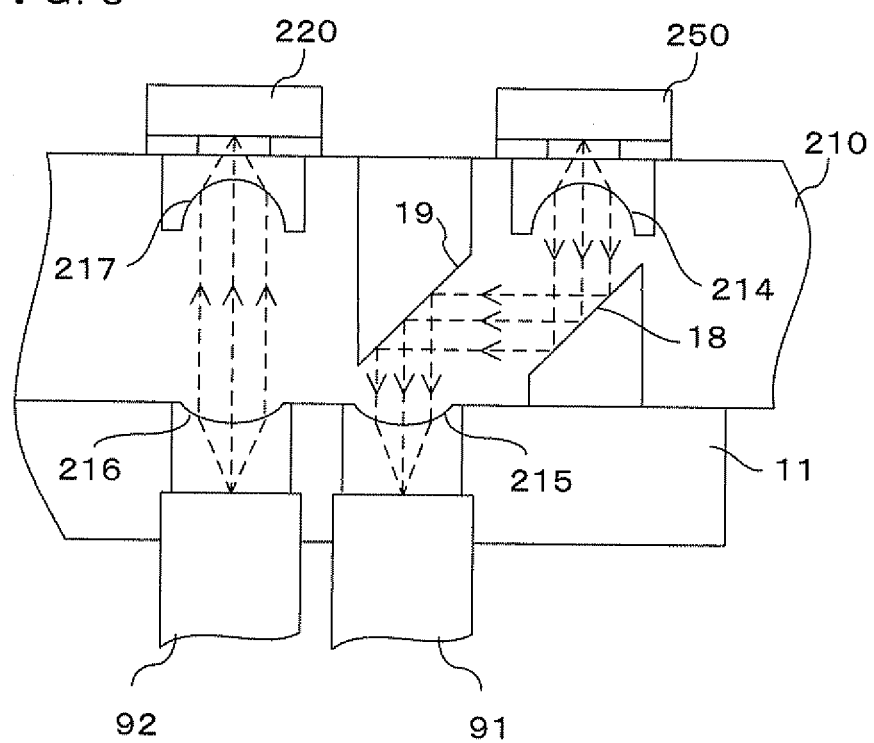
FIG. 8 is a schematic view for explaining light transmitted by the photodiode and laser diode with the optical fiber.

FIG. 8 is a schematic view for explaining light transmitted by the photodiode 220 and laser diode 250 with the optical fibers 91, 92. Although FIG. 8 is similar to the OSA 201 shown in FIG. 5, but some of reference numerals and parts are omitted in FIG. 8.

The light emitted from the receiving optical fiber 92 comes into the third lens surface 216 of OSA 201 arranged opposite to the optical fiber 92, and then converted into the substantially parallel light. The substantially parallel light passes through the basement 210, enters the fourth lens surface 217 and collected at the light receiving portion 22 of the photodiode 220 by the fourth lens surface 217. It should be noted that the positions of optical fiber 92 and third lens surface 216 are decided in consideration of the broadened range of light emitted from the optical fiber 92, in order to avoid the direct entering of major part of the light emitted from the optical fiber 92 into the first lens surface 214 (however, partial light reaching to the laser diode 250 poses no problems, because such light reaching to the laser diode 250 is weak and the laser diode 250 has a higher resistance against the external light than the photodiode 220).

The light emitted from the light emitting portion 52 of the laser diode 250 enters the first lens surface 214 of the OSA 201 arranged opposite to the laser diode 250, and then converted into the substantially parallel light. The substantially parallel light passes through the basement 210 and reaches to the reflecting surface 18. That light is totally reflected toward the reflecting surface 19 by the reflecting surface 18, further passes through the basement 210 and reaches the reflecting surface 19. The light is then totally reflected toward the second lens surface 215 by the reflecting surface 19, and then are collected at the sending optical fiber 91 by the second lens surface 215. Almost all of the light emitted by the laser diode 250 can be reflected by the reflecting surfaces 18, 19 and enter the second lens surface 215, by properly setting the refraction rate of the transparent synthetic resin forming the reflecting surfaces 18, 19 and the like, the angle of reflecting surfaces 18, 19, the range of light entering the reflecting surfaces 18, 19 and the like. Therefore, it is possible to prevent the light emitted by the laser diode 250 from leaking the fourth lens surface 217 side and received by the photodiode 220 after reflected by the reflecting surfaces 18, 19.

For example, when "θ" represents the entering angle of light with respect to the reflecting surfaces 18, 19 and "n" represents the refraction rate of synthetic resin forming the reflecting surfaces 18, 19, it is possible by setting the angles of reflecting surface 18, 19 satisfying the total reflection condition (sin θ=1/n) to prevent the light emitted by the laser diode 250 from leaking to the fourth lens surface 217 side.

The OSA 201 described above includes the photodiode 220 and laser diode 250, and can perform the transmission for the optical communication by itself. Thus, it is possible to reduce the size and cost of the communication apparatus including the OSA 201. Although the photodiode 220 and laser diode 250 are spaced apart from each other in order to avoid the crosstalk effect, it is possible by utilizing the reflecting surfaces 18, 19 to narrow the distance between the second lens surface 215 and the third lens surface 216 that perform receiving and emitting of light with the optical fibers 91, 92. Thus, it is possible to arrange two optical fibers closer. Therefore, it is possible to downsize the optical communication module. Furthermore, it is possible to effectively utilize the inside space of basement 210, and prevent the OSA 201 from becoming larger.

The light emitted from the first lens surface 214 is the substantially parallel light, reflected by the reflecting surfaces 18, 19 and reaches to the second lens surface 215. It is possible to prevent the light from leaking toward the third lens surface 216 side. Therefore, it is possible in the OSA 201 of the present invention to prevent the light leakage and wrong transmission of optical signals, even when the OSA 201 is downsized.

Although one of preferred embodiments according to the present invention has been explained in detail, each configuration, operation and the like can be changed adequately and the present invention is not limited to the embodiment described above. For example, although the OSA 201 in the embodiment is illustrated to include two photoelectric devices, i.e., photodiode 220 and laser diode 250, the present invention is not limited to the illustration. In another example case, three or more photoelectric devices may be provided. In that case, it is preferred that the light receiving element and light emitting element are arranged alternately. In another example case, the laser diode 250 may be replaced by the photodiode and the optical fiber 91 may be replaced by a receiving optical fiber. At that time, the photodiode receives light emitted by the optical fiber 91 through the second lens surface lens surface 215, reflecting surfaces 19, 18 and first lens surface 214.

(Variation)

Figure 9:
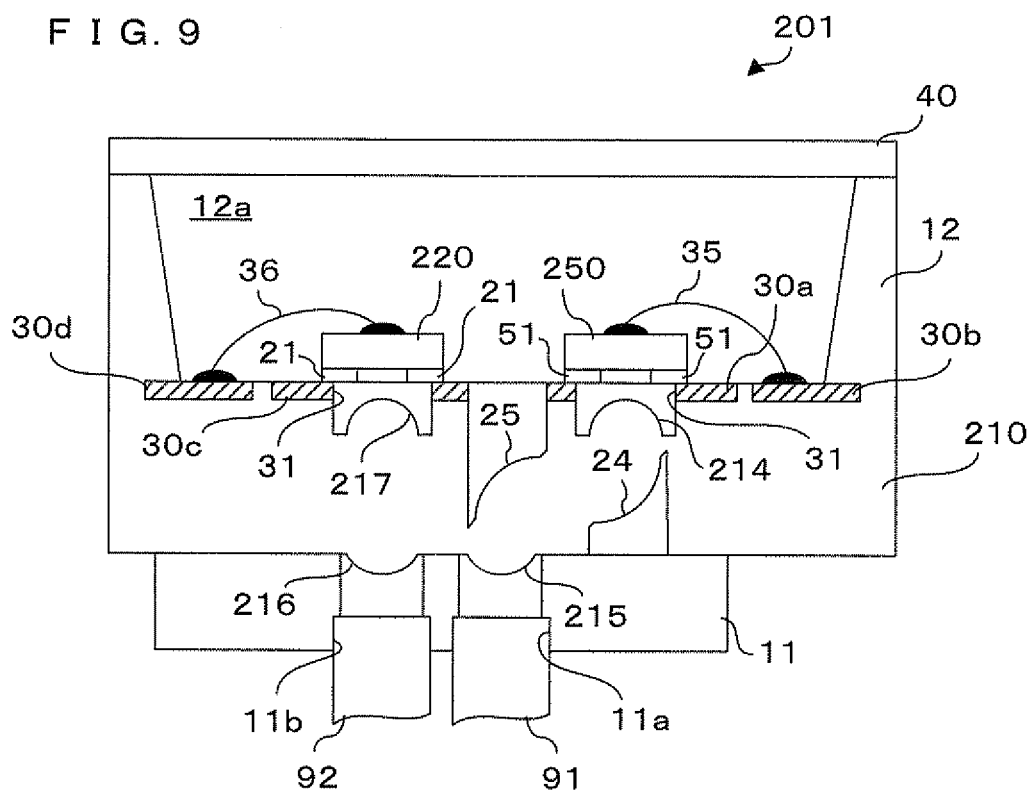
FIG. 9 is a schematic view showing a configuration of the optical communication module according to a variation for the embodiment 2 of the present invention.

Although the light from the first lens surface 214 to the second lens surface 215 is reflected by the reflecting surfaces 18, 19, these reflecting surfaces 18, 19 may be replaced by curved surface lenses. FIG. 9 is a schematic view showing a configuration of the optical communication module according to a variation for the embodiment 2 of the present invention. The OSA 201 in the variation includes lenses 24, 25, instead of reflecting surfaces 18, 19 as illustrated in FIG. 5. The lenses 24, 25 are arranged at the same positions of reflecting surfaces 18, 19, respectively, and the optical axis of light entering one of them is equal to the optical axis of light reflected from the other one of them. Thus, the lens 24 reflects the substantially parallel light from the first lens surface 214 toward the lens 25, and the lens 25 reflects the reflected light toward the second lens surface 215. Thus, it is possible to make the light from the first lens surface 214 become the substantially parallel light and reach to the second lens surface 215. Therefore, it is possible to prevent the light leakage to the photodiode 220 side. Alternatively, the OSA 201 in the variation may include one reflecting surface (18 or 19) and one lens (24 or 25).

Figure 10:
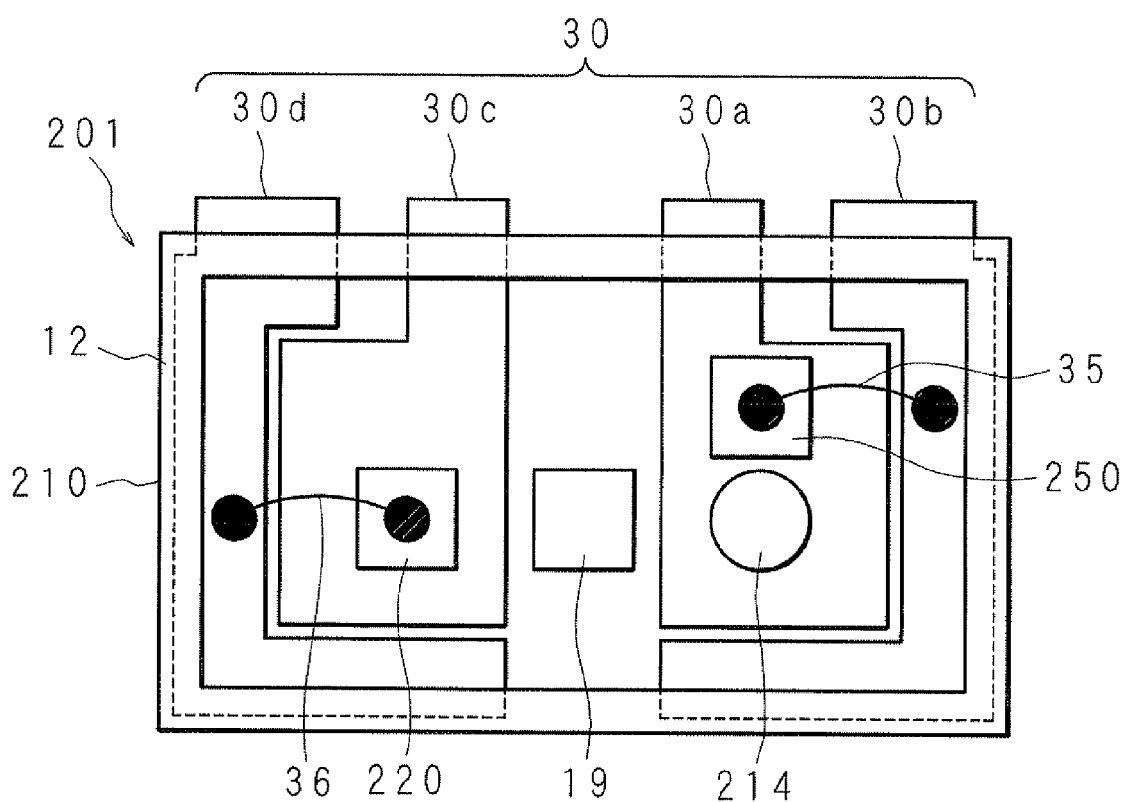
FIG. 10 is a schematic plane view showing a configuration of the optical communication module according to the variation for the embodiment 2 of the present invention.

The laser diode 250 may be the edge-emitting laser. FIG. 10 is a schematic plane view showing a configuration of the optical communication module according to the variation for the embodiment 2 of the present invention, and illustrates a condition where the cover 40 of the optical communication module is not applied. In the OSA 201 of the variation, the first lens surface 214 is convex upwardly from the upper surface of basement 210, and the first lens surface 214 and laser diode 250 are aligned on the upper surface. The first lens surface 214 is configured to receive the light from the laser diode 250, refracts the entered light to be the substantially parallel light along the upper surface of basement 210, and reflect the refracted light to direct vertically downward. In short, the light refracted and reflected by the first lens surface 214 becomes the parallel light and reaches to the reflecting surface 18. At that time, it is possible to prevent the light of laser diode 250 from reaching to the light receiving portion 22 of the photodiode 220. Therefore, it is possible to prevent the light leakage and the wrong transmission of optical signals.

Embodiment 3

Figure 11:
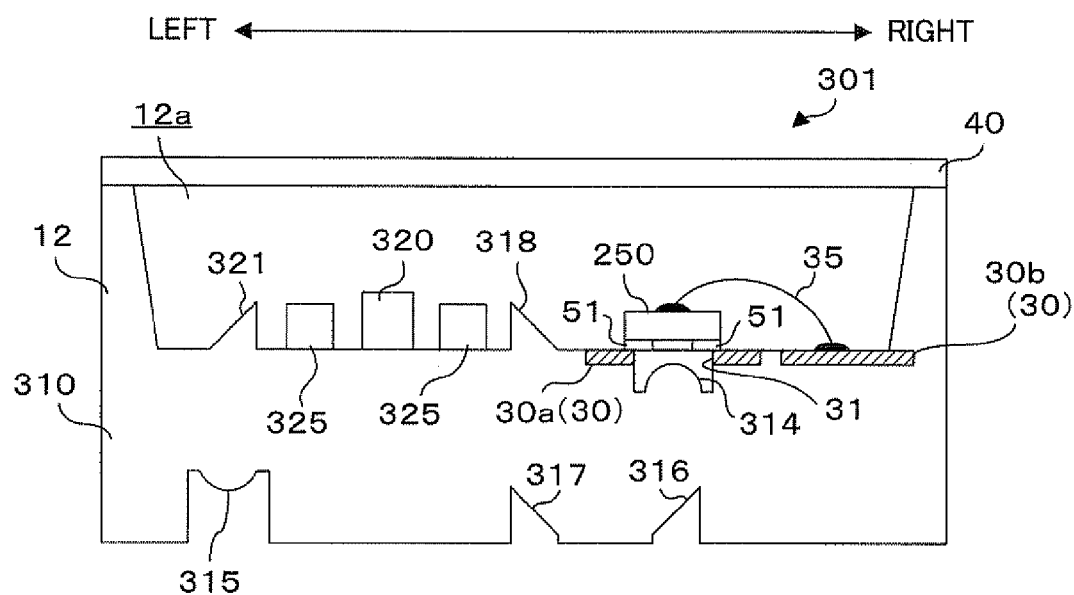
FIG. 11 is a schematic cross section view showing a configuration of the optical communication module according to an embodiment 3 of the present invention.
Figure 12:
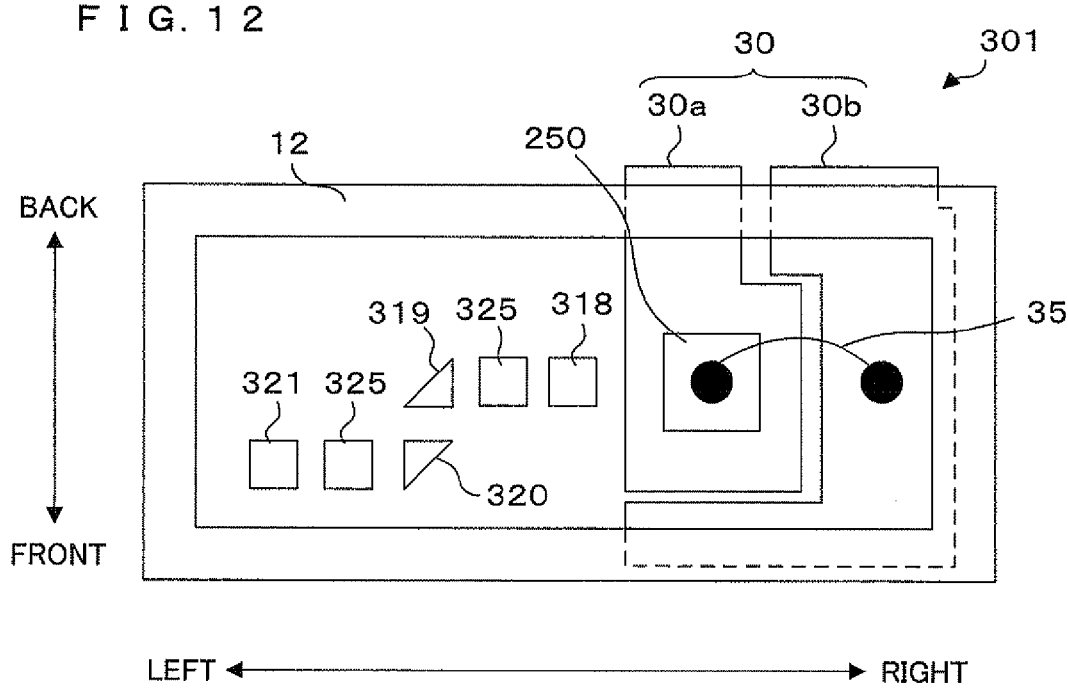
FIG. 12 is a plane view showing the optical communication module illustrated in FIG. 11.

FIG. 11 is a schematic cross section view showing a configuration of the optical communication module according to an embodiment 3 of the present invention. FIG. 12 is a plane view showing the optical communication module illustrated in FIG. 11, and illustrates a condition where a cover (described later) of the optical communication module is not applied.

In figures, the reference numeral "301" represents an OSA configured as one component corresponding to the optical communication module according to the present invention and in which the laser diode (light emitting element) 250 is sealed. The OSA 301 includes the platy basement 310 whose shape is substantially rectangular in a plan view. The basement 310 is made of synthetic resin that passes light. The one surface (upper surface [front surface] in FIG. 11, hereinafter called as upper surface, simply) of basement 310 is connected to the laser diode 250. The peripheral wall 12 is arranged on the upper surface of basement 310 to follow the outer perimeter of the peripheral portion. The upper surface of basement 310 and the peripheral wall 12 configure the recess potions 12a that accommodates the laser diode 250.

The laser diode 250 is a plate whose shape in a plan view is substantially square, and includes the light emitting portion 52 that emits light in response to electrical signals at substantially the center on the lower surface, and one or more connection terminals 51 around the light emitting portion 52. The connection terminal 51 is a terminal for inputting and outputting electrical signals for the laser diode 250, and for connecting the laser diode 250 to the conductive plate 30 with solder, conductive adhesive or the like. It should be noted that the OSA 301 in the following explanation and figures includes the laser diode 250 shown in FIG. 7A.

The conductive plate 30 (30a, 30b) made of metal is embedded in and held by the basement 310 of OSA 301, one surface thereof exposed to the recess portion 12a. The exposed portion of the conductive plate 30 in the recess portion 12a is connected to the connection terminal 51 of the laser diode 250 with solder, conductive adhesive or the like, and connected to a terminal arranged on the upper surface of the laser diode 250 or the like with the wire 35. In the recess portion 12a, the laser diode 250 is aligned with the longitudinal direction of the basement 310. The conductive plate 30 is for performing the transmission of electrical signals between the laser diode 250 and the outside. In other words, the conductive plate 30 works as a wire for connecting circuit components on the communication circuit utilizing the laser diode 250.

The OSA 301 in the embodiment 3 includes the conductive plates 30a, 30b and is connected to the laser diode 250. The first conductive plate 30a is aligned with the longitudinal direction of the basement 310, and includes a substantially square shaped portion having a substantially circular opening 31, and a portion extending from the square shaped portion to the external part at the long side of the basement 310. The diameter of opening 31 is shorter than one side of the lower surface of laser diode 250, but longer than the diameter of light emitting portion 52 of the laser diode 250. The connection terminal 51 of the laser diode 250 is connected to the peripheral portion of the opening 31 of the first conductive plate 30a with the solder, conductive adhesive or the like.

The second conductive plate 30b is arranged along the periphery of basement 310 to surround the first conductive plate 30a, and one end portion of the second conductive plate 30b is extending from the long side of basement 310 to the outside. The second conductive plate 30b is connected to a terminal arranged on the upper surface of the laser diode 250 with the wire 35.

Ends of two conductive plates 30a, 30b are extending from one long side of the basement 310, respectively. These extending portions are utilized, for example, as terminals for connecting the OSA 301 to a circuit board in a communication apparatus. The communication apparatus including the OSA 301 can transmit optical signals by applying a predetermined voltage between the first conductive plate 30a and the second conductive plate 30b.

In the description below, the side where the second conductive plate 30b is arranged in the longitudinal direction of the basement 310 is called the right side (right side in FIG. 11 and FIG. 12), and the side opposite to the second conductive plate 30b is called the left side (left side on FIG. 11 and FIG. 12). Further, the side where the end portions of conductive plates 30a, 30b are extending from one long side of the basement 310 is called the back side (upper side on FIG. 12), and the opposite side thereto is called the front side (lower side on FIG. 12). Furthermore, the direction parallel to the upper lower-surface of the basement 310 is referred to as a plane direction, and the direction perpendicular to the plane direction as the vertical direction.

On the upper surface of basement 310, the substantially circular concave portion is formed to continue to the opening 31 of the conductive plate 30. At the bottom part of this concave portion, the first lens surface (first convex lens) 314 is arranged to be convex upwardly. The optical axis of the first lens surface 314 is parallel to the vertical direction, and the center of the first lens surface 314 matches with the center of the light emitting portion 52 of the laser diode 250. The first lens surface 314 is formed to receive the light emitted by the laser diode 250 through the opening 31, and to convert the received light into the substantially parallel light. Thus, the substantially parallel light converted by the first lens surface 314 is directed toward the lower surface of the basement 310 along the vertical direction, and passes through the basement 310.

On the lower surface of the basement 310, the first reflecting surface (first reflecting portion) 316 is arranged to cross the optical axis of the first lens surface 314 and to be angled about 45 degrees with respect to the plane direction. For example, a rectangle concave portion is formed on the lower surface of the basement 310 and the bottom surface of the concave portion is inclined, in order to form the first reflecting surface 316. The optical axis of the first reflecting surface 316 for the incident light substantially matches with the optical axis of the first lens surface 314, and the optical axis of the first reflecting surface 316 for the reflecting light substantially matches with the longitudinal direction of the first lens surface 314. The first reflecting surface 316 completely reflects the substantially parallel light coming from the first lens surface 314, at about 45 degrees, toward the left side in the longitudinal direction of the basement 310.

On the lower surface of the basement 310, the second reflecting surface (second reflecting portion) 317 is arranged at more left side along the longitudinal direction than the first reflecting surface 316, to be angled about 45 degrees with respect to the plane direction, reverse to the first reflecting surface 316. A rectangle concave portion is formed on the lower surface of the basement 310 and the bottom surface of the concave portion is inclined, in order to form the second reflecting surface 317, similarly to the first reflecting surface 316. The optical axis of the second reflecting surface 317 for the incident light substantially matches with the optical axis of the first reflecting surface 316 for the reflecting light, and the optical axis of the second reflecting surface 317 for the reflecting light substantially matches with the vertical direction. The second reflecting surface 317 completely reflects the substantially parallel light reflected by the first reflecting surface 316, at about 45 degrees, upwardly in the vertical direction.

On the upper surface of the basement 310, the third reflecting surface (third reflecting portion) 318 is arranged to be angled about 45 degrees in the same direction as the second reflecting surface 317 with respect to the plane direction, and to protrude in parallel to and opposite to the second reflecting surface 317. For example, a rectangle concave portion is formed on the upper surface of the basement 310 and the upper surface of the concave portion is inclined, in order to form the third reflecting surface 318. The optical axis of the third reflecting surface 318 for the incident light substantially matches with the optical axis of the second reflecting surface 317 for the reflecting light, and the optical axis of the third reflecting surface 318 for the reflecting light substantially matches with the longitudinal direction of the basement 310. The third reflecting surface 318 reflects the substantially parallel light reflected by the second reflecting surface 317 toward the left side in the longitudinal direction of the basement 310. In addition, the substantially parallel light reflected by the third reflecting surface 318 comes straightly above the upper surface of the basement 310, because the third reflecting surface 318 is arranged to protrude on the upper surface of the basement 310.

On the upper surface of the basement 310, the fourth and fifth reflecting surfaces 319, 320 are arranged to straightly refract the substantially parallel light reflected by the third reflecting surface 318 and coming straightly toward the left side in the longitudinal direction. The fourth and fifth reflecting surfaces (pair of reflecting surfaces) 319, 320 are aligned in parallel with and opposite to each other along the front-back direction of the basement 310 to protrude perpendicularly on the upper surface of the basement 310. The fourth reflecting surface 319 is arranged at the position where the fourth reflecting surface 319 crosses the optical axis of the third reflecting surface 318 for the reflecting light, and is angled about 45 degrees with respect to the optical axis. The fifth reflecting surface 320 is arranged along the front-back direction at more front side than the fourth reflecting surface 319, and is angled about 45 degrees similarly to the fourth reflecting surface 319. The optical axis of the fourth reflecting surface 319 for the incident light substantially matches with the optical axis of the third reflecting surface 318 for the reflecting light, and the optical axis of the fourth reflecting surface 319 for the reflecting light substantially matches with the optical axis of fifth reflecting surface 320 for the incident light. The optical axis of the fifth reflecting surface 320 for the reflecting light substantially matches with the longitudinal direction. The fourth reflecting surface 319 reflects the substantially parallel light reflected by the third reflecting surface 318 toward the fifth reflecting surface 320, and then the fifth reflecting surface 320 reflects the substantially parallel light reflected by the fourth reflecting surface 319 toward the left side of the longitudinal direction of the basement 310.

On the upper surface of the basement 310, the sixth reflecting surface (fourth reflecting portion) 321 is arranged to be protruding and angled about 45 degrees with respect to the plane direction reversely to the third reflecting surface 318, to reflect the light reflected by the fifth reflecting surface 320 downwardly in the vertical direction. A rectangle convex portion is formed on the upper surface of the basement 310 and the upper surface of the convex portion is inclined in order to form the sixth reflecting surface 321, similarly to the third reflecting surface 318. The sixth reflecting surface 321 is aligned along the longitudinal direction with the fifth reflecting surface 320. The optical axis of the sixth reflecting surface 321 for the incident light substantially matches with the optical axis of the fifth reflecting surface 320 for the reflecting light, and the optical axis of the sixth reflecting surface 321 for the reflecting light substantially matches with the vertical direction. The sixth reflecting surface 321 completely reflects the substantially parallel light reflected by the fifth reflecting surface 320 downwardly at about 45 degrees with respect to the vertical direction.

On the lower surface of the basement 310, a substantially circular concave portion is formed at the position opposite to the sixth reflecting surface 321. At the bottom part of the concave portion, the second lens surface (second convex lens) 315 is arranged to protrude downwardly. The optical axis of the second lens surface 315 substantially matches with the optical axis of the sixth reflecting surface 321 for the reflecting light, and receives the substantially parallel light reflected by the sixth reflecting surface 321. The second lens surface 315 is formed to focus the incident parallel light at the optical fiber (not shown in figures) held under the second lens surface 315.

The basement 310 described above is configured to support the optical element 325 at the upper surface for performing the modulation or filtering on the light emitted from the laser diode 250 before the light reaches the optical fiber. For example, the optical element 325 is a modulator, band pass filter, optical divider, lens, monitor PD (photo diode), isolator, switch or the like. In FIG. 11 and FIG. 12, the optical element 325 is arranged between the third and fourth reflecting surfaces 318 and 319, while another optical element 325 is arranged between the fifth and sixth reflecting surfaces 320 and 321. The light output from the laser diode 250 is converted into the substantially parallel light by the first lens surface 314, is reflected by the first, second and third reflecting surfaces, 316, 317, 318, straightly moves in parallel to the upper surface above the upper surface of the basement 310, and is straightly refracted by the fourth and fifth reflecting surfaces 319, 320. Therefore, it is possible to determine the position of the optical element 325 without centering the optical axis of the optical element 325 with respect to the laser diode 250 or the optical fiber. The optical element 325 may be arranged between the fourth and fifth reflecting surfaces 319 and 320. Plural optical elements 325 may alternatively be arranged between each pair of two reflecting surfaces. Further, the light straightly moving along the upper surface of the basement 310 may be divided using synthetic resin for forming the basement 310. When only the laser diode and isolator (or only the laser diode, monitor PD and isolator) are arranged, it is possible to implement a light transmission sub-assembly having a small isolator.

Transparent synthetic resin is utilized for integrally forming the basement 310, peripheral wall 12, each of lens surfaces 314, 315, reflecting surfaces 316-321, and the like in the OSA 301. For example, the conductive plate 30 previously formed in a predetermined shape is put in a mold tool and then liquid transparent resin is poured and cured, i.e., injection molding method can be utilized, in order to form the OSA 301 integrally in the manufacturing of the OSA 301. Because the laser diode 250 is connected to the conductive plate 30 exposed to the basement 310 after the integral forming is performed with the synthetic resin, it is possible regardless of heat resistance of the laser diode 250 and the like to select the synthetic resin for forming the basement 310, peripheral wall 12 and the like. Therefore, it is possible to select the synthetic resin that has a higher formability and is hardly deformed in response to the peripheral environment, such as temperature change.

For integrally forming the basement 310 and the like, it is preferred to select the synthetic resin whose refraction rate is about 1.5. In such a case, the critical angle for the reflecting surfaces 316-321 becomes $\sin(-1\,(1/1.5))=41.8$, and thus it is possible to reflect the light angled about 45 degrees.

The OSA 301 further includes the cover 40 that is jointed to the upper end of the peripheral wall 12 arranged on the upper surface of the basement 310 to seal the recess portion 12a. The cover 40 is formed in substantially rectangular plate similar to the basement 310, in a plain view. For example, the cover 40 is connected to the upper end of the peripheral wall 12 by ultrasonic welding method, adherence method with adhesive or the like. The cover 40 may be transparent or non-transparent, be made of material the same as or different from the basement 310, peripheral wall 12 and the like. Nitrogen gas, dry air or the like may be injected into the recess portion 12a or the recess portion 12a may be vacuumed, when the cover 40 is jointed. Although the cover 40 is utilized for the sealing, it is possible to utilize the potting with transparent resin or double molding with mold tool and transparent resin (transfer molding is utilized for the transparent resin).

Figure 14:
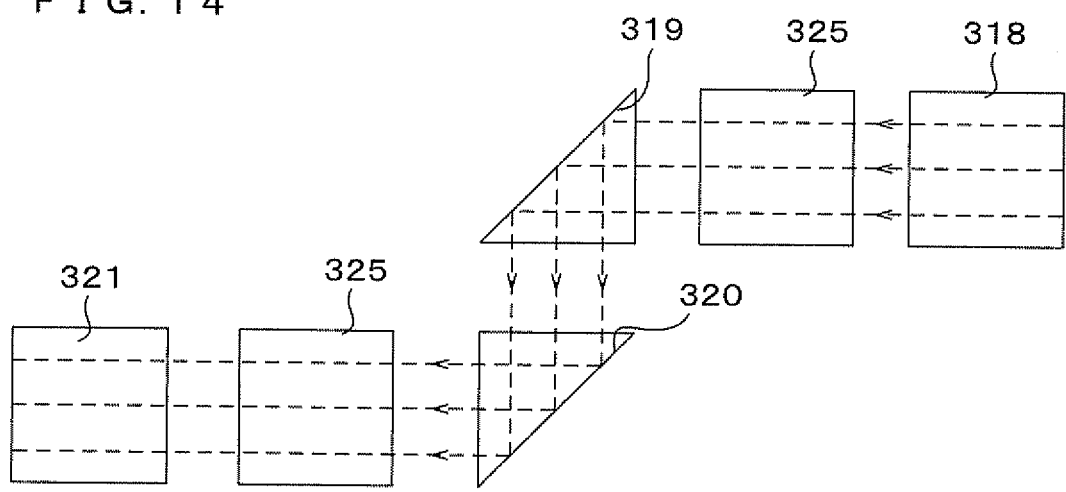
FIG. 14 is another schematic view for explaining light transmitted between the laser diode and the optical fiber.

The OSA 301 of the present invention is mounted on a circuit board or the like of a communication apparatus in which the second lens surface 315 is arranged opposite to the end surface of the optical fiber. FIG. 13 and FIG. 14 are schematic views for illustrating light transmitted between the laser diode 250 and the optical fiber. As FIG. 13 and FIG. 14 illustrate the OSA 301 shown in FIG. 11 and FIG. 12, the reference numerals and members are partially omitted in FIG. 13 and FIG. 14.

The light emitted by the laser diode 250 reaches to the first lens 314 with a predetermined diffusion range. The convex surface of first lens 314 is configured in consideration of the distance to the laser diode 250 to convert the light from the laser diode 250 into the substantially parallel light. Thus, the light emitted from the laser diode 250 is converted into the substantially parallel light by the first lens 314, passes through the transparent basement 310, and reaches to the first reflecting surface 316. Then, the light is completely reflected by the first reflecting surface 316 toward the second reflecting surface 317, passes through the basement 310 and reaches to the second reflecting surface 317. Then, the light is completely reflected by the second reflecting surface 317 toward the third reflecting surface 318, passes through the basement 310 and reaches to the third reflecting surface 318. As the refraction rates of transparent synthetic resin forming the first and second reflecting surfaces 316, 317, inclined angle, angle range of incident light to the first and second reflecting surfaces 316, 317 and the like are properly set, it is possible to make the first and second reflecting surfaces 316, 317 reflect all of the light emitted from the laser diode 250 and to make the reflected light reach the third reflecting surface 318.

The light having reached the third reflecting surface 318 is reflected completely by the third reflecting surface 318, and moves straightly above the upper surface of the basement 310. The straight light is, for example, modulated by the optical element 325, reaches to the fourth reflecting surface 319 and then reflected toward the fifth reflecting surface 320 by the fourth reflecting surface 319. Furthermore, the light is reflected by the fifth reflecting surface 320 and moves straight toward the sixth reflecting surface 321. The straight light is, for example, modulated by the optical element 325, reaches to the sixth reflecting surface 321, is completely reflected by the sixth reflecting surface 321 toward the second lens surface 316, and is focused at the optical fiber 9 by the second lens surface 316. The convex surface of the second lens surface 316 is configured in consideration of the distance to the optical fiber 9 to focus the substantially parallel light having passed through the basement 310 at the optical fiber 9.

In the OSA 301 described above, the light emitted from the laser diode 250 is converted into the substantially parallel light by the first lens surface 314, the direction of the substantially parallel light is changed by the reflection of the plural reflecting surfaces 316-321, and then the substantially parallel light reaches to the second lens surface 315 from the first lens surface 314. Therefore, it is possible to make the second lens surface 315 focus the light emitted from the first lens surface 314 at the optical fiber, even when different mold tools are utilized for forming the front and back surfaces of the basement 310 and the centers of first and second lens surfaces 314, 315 on the front and back surfaces of the basement 310 are not aligned because of the positional aberration between these two mold tools. Therefore, it is possible in the optical communication module of the present invention to avoid the deterioration of communication performance, even when the positioning of two lenses is not accurate.

In addition, the parallel light coming from the first lens surface 314 to the second lens surface 315 can be emitted above the basement 310 at one time, and a modulator or the like can be arranged on the upper surface of the basement 310. At that time, the position of optical element 325 can be determined without centering the optical axis to the laser diode 250 and the like. Therefore, it is possible in the optical communication module of the present invention to easily and precisely match the connected position of the optical element 325 with the connected positions of laser diode 250 and optical fiber 9. Therefore, it is possible to avoid the deterioration of the communication performance.

Although it is described above about one of the best modes for the present invention, it is possible to properly change each configuration, operation or the like. Thus, the present invention is not limited to the embodiment particularly described above. For example, although it is described to utilize the laser diode 250 in the embodiment as the photoelectric device included in the OSA 301, a photodiode may be utilized as the photoelectric device and the OSA 301 may be configured to be a receiving optical communication module. In this case, the light emitted from the optical fiber arranged opposite to the second lens surface 315 enters the first lens surface 314 through each reflecting surface and then is focused by the first lens surface 314 at the photodiode. In addition, although the laser diode 250 and first lens surface 314 are described to be overlaid in the vertical direction, the laser diode 250 may be an edge-emitting laser and be aligned with the first lens surface 314 in the plane direction. Here, it is preferred to arrange the first lens surface 314 to protrude from the upper surface of the basement 310.

The third reflecting surface 318 and sixth reflecting surface 321 may be aligned on one straight line. At that time, the first and second lens surfaces 314, 315 are aligned on one straight line with respect to the plane direction on the upper and lower surfaces of the basement 310. Thus, the fourth and fifth reflecting surfaces 319, 320 are not required. Because this configuration allows arrangement of a modulator on the straight line of the fourth and fifth reflecting surfaces 319, 320, it is possible to avoid the positional aberration for the modulator and the like. This can enhance the performance of light communication.

Each reflecting surface may be curved. For example, the first reflecting surface 316 may be a lens surface protruding toward the lower surface of the basement, and the first lens surface 314 may not be provided. At that time, the light emitted from the laser diode 250 is refracted and reflected to be the parallel light by the first reflecting surface 316, and straightly moves toward the second reflecting surface 317. Thus, it is easy to prepare the basement 310, because it is not required to arrange the first lens surface 314 on the basement 310.

Although it is described that the second lens surface 315 is arranged on the lower surface of the basement 310 to focus the light at the optical fiber held under the second lens surface 315, the second lens surface 315 may be arranged on the upper surface of the basement 310 and the optical fiber may be held above the second lens surface 315, for example, by the cover 40. Alternatively, the optical fiber may be held at the side surface of the OSA 301, for example, by the peripheral wall 12. In that alternative case, the second lens surface 315 needs to be formed to reflect the light in the normal direction of the basement 310 in the plane direction and to focus the reflected light at the optical fiber that is held at the side surface. Additionally, in that alternative case, two solid mold tools may be utilized for forming the first and second lens surfaces 315, 316. A slide mold tool may be utilized when the solid mold tool cannot be used due to the shape of the second lens surface 315.

It is described in the embodiments 1-3 that the optical fiber is arranged at the lower surface side (i.e., the side opposite to the side where the photoelectric device is mounted) of the transparent basement and the light transmission from the basement to the optical fiber and vice versa is carried out at the lower surface side of the basement. However, the present invention is not limited to the description. The light transmission may be carried out at the upper surface side (i.e., the same side as the side where the photoelectric device is mounted) of the basement, or at the side surface of the basement. The proper arrangement of reflecting portions on the OSA can realize various combinations for the mounting position of the photoelectric device and the position of transmitting light between the basement and the optical fiber.

What is claimed is:

1. An optical communication module for performing a optical transmission, comprising:
    a transparent board on which a convex lens and a photoelectric device are arranged;
    a convex portion arranged on a front surface of the transparent board; and
    a reflecting portion that reflects light, wherein
    the reflecting portion is optically connected to the convex lens and arranged on the transparent board,
    the optical transmission is performed with the photoelectric device through the convex lens, the transparent board, and the reflecting portion,
    the photoelectric device is aligned with the convex portion on the front surface of the transparent board, and optically connected to the convex portion,
    the convex lens is integrally formed on a back surface of the transparent board,
    the convex portion intersects an optical axis of the convex lens, and
    the convex portion works as the reflecting portion.

2. An optical communication module according to claim claim 1, wherein
    the photoelectric device is a light emitting element that converts electrical signals into optical signals, and
    the convex portion refracts fight emitted from the photoelectric device to be substantially parallel light along the front surface on the transparent board, and directs the refracted light toward the back surface.

3. An optical communication module according to claim 1, wherein
    light is transmitted between the photoelectric device and the convex lens through the convex portion.

4. An optical communication module according to claim 3, wherein
    light between the convex portion and the convex lens becomes substantially parallel light that passes into the transparent board.

5. An optical communication module according to claim 3, further comprising:
    a cylindrical portion into which a optical communication line is fit, wherein
    the cylindrical portion is arranged to protrude on the transparent board and to surround the convex lens, and
    the optical transmission is performed with the photoelectric device through the cylindrical portion, the convex portion and the convex lens.

6. An optical communication module according to claim 1, wherein
    the transparent board includes a concave portion between the photoelectric device and the convex portion.

7. An optical communication module, comprising:
    a transparent board that includes a first photoelectric device and a second photoelectric arranged with a space on a front surface of the transparent board;
    a first convex lens that is integrally arranged on the front surface of the transparent board;
    a second convex lens that is integrally arranged on a back surface of the transparent board, and is opposite to the space between the first photoelectric device and the second photoelectric device;
    a third convex lens that is integrally arranged on the back-surface of the transparent board, and transmits light with the second photoelectric device; and
    a pair of reflecting portions arranged in the transparent board, wherein
    one of the reflecting portions intersects an optical axis of the first convex lens, and another of the reflecting portions intersects an optical axis of the second convex lens,
    light is transmitted between said one of the reflecting portions and the first convex lens,
    light is transmitted between said another one of the reflecting portions and the second convex lens, and
    the optical transmission is performed with the first photoelectric device through the first convex lens, the second convex lens and the par of reflecting portions.

8. An optical communication module according to claim 7, wherein
    an optical axis of the first convex lens is substantially parallel to an optical axis of the second convex lens, and
    each reflecting portion is angled about 45 degrees with respect to a plain surface direction of the transparent board.

9. An optical communication module according to claim 8, wherein
    the transparent board includes concave portions on the front surface and the back surface, and
    the pair of reflecting portions are bottom surfaces of the concave portions, respectively.

10. An optical communication module according to claim 7, wherein
    the first photoelectric device is a light emitting element that emits light converted from electrical signals, and
    the second photoelectric device is a light receiving element that converts received light into electrical signals.

11. An optical communication module according to claim 1, further comprising:
    a first convex lens formed on a front surface of the transparent board;
    a second convex lens formed on a back surface of the transparent board;
    a first reflection surface that is arranged in the transparent board and intersects an optical axis of the first convex lens;
    a second reflection surface that is arranged in the transparent board and is inclined with respect to the back surface in a direction reversely to the first reflecting surface;
    a third reflection surface that is arranged on the front surface of the transparent board and is inclined with respect to the front surface in a direction same as the second reflection surface; and
    a fourth reflection surface that is arranged on the front surface of the transparent board and intersects an optical axis of the second convex lens, wherein the second reflection surface is opposite to the third reflection surface through an inside of the transparent board,
    light is transmitted between the third reflection surface and the fourth reflection surface, and
    the optical transmission is performed with the photoelectric device through the first reflection surface, the second reflection surface, the third reflection surface, the fourth reflection surface, the first convex lens and the second convex lens.

12. An optical communication module according to claim 11, wherein
    an optical axis of the first convex lens and an optical axis of the second convex lens are parallel to a direction from the second reflection surface to the third reflection surface,
    the first reflection surface, the second reflection surface, the third reflection surface and the fourth reflection surface are angled about 45 degrees with respect to the direction from the second reflection surface to the third reflection surface, respectively.

13. An optical communication module according to claim 11, wherein
the second convex lens is arranged on an extended line of an imaginary line that continues from the first refection surface to the second reflection surface,
the third reflection surface is opposite to the fourth reflection surface in an extending direction of the imaginary line,
the transparent board comprises a pair of reflection surfaces on the front surface,
one of the reflection surfaces is aligned with the third reflection surface, and another one of the reflection surfaces is aligned with the fourth reflection surface, and
light is transmitted between the pair of reflection surfaces and the first and the fourth reflection surfaces.

14. An optical communication module according to claim 11, further comprising:
another photoelectric device that is arranged on a path of light coming between the third reflection surface and the fourth reflection surface.

15. An optical communication module according to claim 2, wherein
light is transmitted between the photoelectric device and the convex lens through the convex portion.

16. An optical communication module according to claim 4, further comprising:
a cylindrical portion into which a optical communication line is fit, wherein
the cylindrical portion is arranged to protrude on the transparent board and to surround the convex lens, and
the optical transmission is performed with the photoelectric device through the cylindrical portion, the convex portion and the convex lens.

17. An optical communication module according to claim 2, wherein
the transparent board includes a concave portion between the photoelectric device and the convex portion.

18. An optical communication module according to claim 3, wherein
the transparent board includes a concave portion between the photoelectric device and the convex portion.

19. An optical communication module according to claim 4, wherein
the transparent board includes a concave portion between the photoelectric device and the convex portion.

* * * * *